(12) United States Patent
Takemura

(10) Patent No.: US 8,947,910 B2
(45) Date of Patent: Feb. 3, 2015

(54) SEMICONDUCTOR DEVICE COMPRISING INVERTERS AND CAPACITOR, AND DRIVING METHOD THEREOF

(75) Inventor: Yasuhiko Takemura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 326 days.

(21) Appl. No.: 13/465,227

(22) Filed: May 7, 2012

(65) Prior Publication Data

US 2012/0287701 A1 Nov. 15, 2012

(30) Foreign Application Priority Data

May 11, 2011 (JP) ................... 2011-106401

(51) Int. Cl.
*G11C 11/00* (2006.01)
*G11C 19/28* (2006.01)
*G11C 11/412* (2006.01)

(52) U.S. Cl.
CPC .............. *G11C 11/412* (2013.01); *G11C 19/28* (2013.01)
USPC .......... 365/154; 365/49.1; 365/149; 365/156; 365/63

(58) Field of Classification Search
CPC .. G11C 11/404; G11C 11/405; G11C 11/406; G11C 11/4074; G11C 11/4091; G11C 11/4087
USPC ............................ 365/49.1, 149, 154, 156, 63
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

(Continued)

*Primary Examiner* — Tha-O H Bui
(74) *Attorney, Agent, or Firm* — Fish & Richardson P.C.

(57) ABSTRACT

A memory device with low power consumption and a signal processing circuit including the memory device are provided. In a memory element including a phase-inversion element by which the phase of an input signal is inverted and the signal is output such as an inverter or a clocked inverter, a capacitor which holds data, and a switching element which controls storing and releasing of electric charge in the capacitor are provided. For example, one of electrodes of the capacitor is connected to an input terminal or an output terminal of the phase-inversion element, and the other electrode is connected to a switching element. The above memory element is used for a memory device such as a register or a cache memory in a signal processing circuit.

20 Claims, 9 Drawing Sheets

(56) References Cited

U.S. PATENT DOCUMENTS

| | | | |
|---|---|---|---|
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,772,053 B2 | 8/2010 | Kameshiro et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0185085 A1* | 10/2003 | Kaneko | 365/230.03 |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170023 A1* | 8/2006 | Nikaido et al. | 257/296 |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0072439 A1 | 3/2007 | Akimoto et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0175062 A1* | 7/2009 | Houston et al. | 365/63 |
| 2009/0278122 A1 | 11/2009 | Hosono et al. | |
| 2009/0280600 A1 | 11/2009 | Hosono et al. | |
| 2009/0291538 A1* | 11/2009 | Mise et al. | 438/216 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0176357 A1 | 7/2011 | Koyama et al. | |
| 2011/0187410 A1 | 8/2011 | Kato et al. | |
| 2011/0193078 A1 | 8/2011 | Takemura | |
| 2012/0032730 A1 | 2/2012 | Koyama | |
| 2012/0257440 A1 | 10/2012 | Takemura | |
| 2012/0262982 A1 | 10/2012 | Takemura | |
| 2012/0275213 A1 | 11/2012 | Takemura | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Intergrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

(56) References Cited

OTHER PUBLICATIONS

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID Digest International Symposium Digest of Technical Papers, May 31, 2009, pp. 1110-1112.

Godo, H et al., "Temperature Dependence of Characteristics and Electronic Structure For Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

(56) References Cited

OTHER PUBLICATIONS

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin Film Transistors Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

\* cited by examiner

SEMICONDUCTOR DEVICE COMPRISING INVERTERS AND CAPACITOR, AND DRIVING METHOD THEREOF

BACKGROUND OF THE INVENTION

1. Field of the Invention

The present invention relates to a memory element including a semiconductor device and a signal processing circuit including the memory element.

2. Description of the Related Art

Transistors using amorphous silicon, polysilicon, microcrystalline silicon, or the like have been used for display devices such as liquid crystal displays conventionally. Nowadays, a technique in which such transistors are utilized for semiconductor integrated circuits is proposed (e.g., see Patent Document 1).

In recent years, a metal oxide having semiconductor characteristics, which is called an oxide semiconductor, has attracted attention as a novel semiconductor material having high mobility equivalent to that of polysilicon or microcrystalline silicon and having uniform element characteristics equivalent to those of amorphous silicon.

The metal oxide is used for a variety of applications. For example, indium oxide is a well-known metal oxide and used as a material of a transparent electrode material included in a liquid crystal display device or the like. As metal oxides having semiconductor characteristics, for example, there are tungsten oxide, tin oxide, indium oxide, zinc oxide, and the like, and a transistor in which a channel formation region is formed using such a metal oxide having semiconductor characteristics has been known (see Patent Documents 2 to 4).

REFERENCE

[Patent Document 1] U.S. Pat. No. 7,772,053
[Patent Document 2] United States Patent Application Publication No. 2007/0072439
[Patent Document 3] United States Patent Application Publication No. 2011/0193078
[Patent Document 4] United States Patent Application Publication No. 2011/0176357

SUMMARY OF THE INVENTION

A signal processing circuit such as a central processing unit (CPU) has a variety of configurations depending on its application but is generally provided with various semiconductor memory devices (hereinafter simply referred to as memory devices) such as a register and a cache memory as well as a main memory for storing data or a program. A register has a function of temporarily holding data for carrying out arithmetic processing, holding a program execution state, or the like. In addition, a cache memory is provided in a CPU so as to be located between an arithmetic unit and a main memory in order to reduce access to the main memory and speed up the arithmetic processing.

In a memory device such as a register or a cache memory, writing of data needs to be performed at higher speed than operation in a main memory. Therefore, in general, a flip-flop is used as a register and an SRAM or the like is used as a cache memory.

FIG. 2A illustrates a memory element which constitutes a register. A memory element 200 illustrated in FIG. 2A includes an inverter 201, an inverter 202, a switching element 203, and a switching element 204. Input of a signal IN to an input terminal of the inverter 201 is controlled by the switching element 203. A potential of an output terminal of the inverter 201 is supplied to a circuit of a subsequent stage as a signal OUT. The output terminal of the inverter 201 is connected to an input terminal of the inverter 202, and an output terminal of the inverter 202 is connected to the input terminal of the inverter 201 via the switching element 204.

When the switching element 203 is turned off and the switching element 204 is turned on, a potential of the signal IN which is input via the switching element 203 is held in the memory element 200.

A specific circuit configuration of the memory element 200 of FIG. 2A is illustrated in FIG. 2B. The memory element 200 illustrated in FIG. 2B includes the inverter 201, the inverter 202, the switching element 203, and the switching element 204, and the connection structure of these circuit elements is the same as that in FIG. 2A.

The inverter 201 includes a p-channel transistor 207 and an n-channel transistor 208 whose gate electrodes are connected to each other. In addition, the p-channel transistor 207 and the n-channel transistor 208 are connected in series between a node to which a high-level power supply potential is supplied in an active state (the node is referred to as VDD) and a node to which a low-level power supply potential is supplied in an active state (the node is referred to as VSS). In a similar manner, the inverter 202 includes a p-channel transistor 209 and an n-channel transistor 210 whose gate electrodes are connected to each other. The p-channel transistor 209 and the n-channel transistor 210 are connected in series between the VDD and the VSS.

The inverter 201 illustrated in FIG. 2B operates such that one of the p-channel transistor 207 and the n-channel transistor 208 is turned on and the other is turned off according to the level of potentials supplied to the gate electrodes thereof. Thus, the current between the VDD and the VSS should be ideally zero. However, actually a minute amount of off-state current flows in the off-state transistor; therefore, the current between the VDD and the VSS can not be zero. A similar phenomenon also occurs in the inverter 202. Therefore, power is consumed in the memory element 200 even in a state where data is just being held.

In the case of an inverter manufactured using bulk silicon, although it depends on the size of a transistor, an off-state current of about 0.1 pA is generated at room temperature at a voltage between the VDD and the VSS of about 1 V, for example. The memory element illustrated in FIGS. 2A and 2B includes two inverters: the inverter 201 and the inverter 202; therefore, an off-state current of about 0.2 pA is generated. In the case of a register including about $10^7$ memory elements, the off-state current of the register is 2 μA.

Further, since the thickness of a gate insulator is reduced in accordance with progress of miniaturization, the amount of gate leakage current flowing between a gate and a channel through the gate insulator positioned therebetween becomes too large to ignore. According to the above, the power consumption of the register is increased against a decrease in a line width of a circuit.

In addition, recently, the threshold value of the transistor has been reduced in order to compensate for a reduction in speed due to lowering of the power supply voltage. However, such reduction in the threshold voltage results in a further increase in the off-state current by approximately three orders of magnitude per inverter, in some cases.

According to the above, the power consumption of the register is increased against a decrease in a line width of a circuit. Furthermore, heat generated by consuming power causes an increase in temperature of the IC chip, and then power consumption is further increased, which results in a vicious circle.

Like the register, an SRAM also includes an inverter, and thus power is consumed due to the off-state current of a transistor. As described above, as in the case of the memory element (register), power is consumed in a cache memory including the SRAM even in a state where writing of data is not performed.

In order to suppress power consumption, a method for temporarily stopping the supply of a power supply potential to a memory device in a period during which data is not input and output has been suggested. A volatile memory device in which data is erased when the supply of a power supply potential is stopped is used for a register, a cache memory, and a main memory. Therefore, in the method, a nonvolatile memory device is provided around the volatile memory device and the data is temporarily transferred to the nonvolatile memory device. However, since such a nonvolatile memory device is mainly formed using a magnetic element or a ferroelectric, the manufacturing process is complex.

In addition, in the case where the power supply is stopped for a long time in a CPU, data in a memory device is transferred to an external memory device such as a hard disk or a flash memory before the power supply is stopped, so that the data can be prevented from being erased. However, it takes time to place the data back in a register, a cache memory, and a main memory from such an external memory device. Therefore, back up of data using the external memory device such as a hard disk or a flash memory is not suitable for the case where the power supply is stopped for a short time (e.g., for 100 microseconds to one minute) for reducing power consumption.

In view of the above-described problems, it is an object of one embodiment of the present invention to provide a signal processing circuit for which a complex manufacturing process is not necessary and whose power consumption can be suppressed and a method for driving the signal processing circuit. In particular, it is an object to provide a signal processing circuit whose power consumption can be suppressed by stopping the power supply for a short time and a method for driving the signal processing circuit.

In a memory element including a logic element by which the phase of an input signal is inverted and the signal is output (hereinafter, the logic element is referred to as a phase-inversion element) such as an inverter or a clocked inverter, a capacitor which holds data and a capacitor switching element which controls storing and releasing of electric charge in the capacitor are provided. One of electrodes of the capacitor is connected to an input terminal or an output terminal of the phase-inversion element, and the other electrode of the capacitor is connected to a source or a drain of the capacitor switching element.

Further, a channel formation region of the capacitor switching element may contain amorphous silicon, polysilicon, microcrystalline silicon, or a compound semiconductor such as an oxide semiconductor (preferably, a wide-bandgap compound semiconductor).

Since it is preferable that the off-resistance of the capacitor switching element be high, a transistor with a channel length that is ten times as large as the minimum feature size or more, preferably 20 times as large as the minimum feature size or more, further preferably 50 times as large as the minimum feature size or more, or larger than or equal to 1 μm may be used. In this case, the channel length of the transistor may be ten times as large as the channel width or more, preferably 20 times large as the channel width or more as, further preferably 50 times as large as the channel width or more.

The above memory element is used for a memory device such as a register, a cache memory, or a main memory in a signal processing circuit. The transistor including an oxide semiconductor is formed to have a long channel, whereby deterioration of the transistor (specifically deterioration of off-state characteristics) caused by a short-channel effect can also be suppressed.

Note that the wide-bandgap compound semiconductor in this specification refers to a compound semiconductor having a bandgap of 2 eV or more. Examples of the wide-bandgap compound semiconductor other than an oxide semiconductor include a sulfide such as zinc sulfide and a nitride such as gallium nitride. It is preferable that the wide-bandgap compound semiconductor be highly purified to extremely reduce the concentration of donor or acceptor.

The capacitor switching element is preferably formed above the phase-inversion element and overlaps therewith. An oxide semiconductor layer used in the capacitor switching element has a meandering shape or at least one hollow portion, thereby being formed in a limited area over (one or plural) phase-inversion elements. Accordingly, the above channel length can be achieved.

Note that one capacitor switching element may be provided above a plurality of phase-inversion elements and overlap therewith. Alternatively, a plurality of capacitor switching elements may be formed above one phase-inversion element and overlap therewith. For example, above a plurality of phase-inversion elements, a plurality of switching elements each of which has a linear shape and a channel length ten times as large as a channel width or more may be provided.

Specifically, the above circuit such as a register or an SRAM includes a circuit in which two phase-inversion elements (such as inverter) are combined (e.g., flip-flop circuit). The area occupied by the circuit in which two inverters are combined is 50 $F^2$ (F is the minimum feature size) or more, and generally 100 $F^2$ to 150 $F^2$. For example, in the case where the area occupied by the circuit in which two inverters are combined is 50 $F^2$ and the capacitor switching element including an oxide semiconductor is provided in the half the area (25 $F^2$) of the circuit in which two inverters are combined, the channel length can be 25 F on the assumption that the channel width is F. When F is 40 nm, the channel length is 1 μm.

Further, the capacitor is also preferably formed above the phase-inversion element and overlaps therewith, and may be formed in the same layer as the capacitor switching element or in a different layer from the capacitor switching element. When the capacitor is formed in the same layer as the capacitor switching element, although it is necessary to form a region for the capacitor switching element and a region for the capacitor, the manufacturing process can be simplified. On the other hand, when the capacitor is formed in a different layer from the capacitor switching element, although the number of steps for manufacturing the capacitor is increased, there are advantages that the integration degree is increased, an area used for the capacitor is increased, and the like. Thus, a dielectric body of the capacitor can be formed using a different component from a gate insulator of the capacitor switching element; as a result, capacitance can be increased.

The on-resistance of the switching element and the capacitance of the capacitor may be determined in accordance with the speed of the needed switching operation. In the case of stopping or resuming supply of the power, 100 microseconds is sufficient for the necessary time for the switching operation. Depending on the purpose, the time for switching may be 100 milliseconds or longer. Further, the off-resistance of the switching element and the capacitance of the capacitor may be determined in accordance with the interval between the needed switching operations. Note that the gate capacitance of the switching element may be larger than the capacitance of the capacitor.

Further, the signal processing circuit includes various logic circuits such as an arithmetic circuit which transmits/receives data to/from the memory device in addition to the above memory device. Not only the supply of power supply voltage to the memory device but also the supply of power supply voltage to the arithmetic circuit which transmits/receives data to/from the memory device may be stopped.

Specifically, a memory element at least includes two phase-inversion elements (first and second phase-inversion elements), a capacitor, and a capacitor switching element which controls storing and releasing of electric charge in the capacitor. A signal including data that is input to the memory element is supplied to an input terminal of the first phase-inversion element. An output terminal of the first phase-inversion element is connected to an input terminal of the second phase-inversion element. An output terminal of the second phase-inversion element is connected to the input terminal of the first phase-inversion element. A potential of the output terminal of the first phase-inversion element or the input terminal of the second phase-inversion element is output to a memory element or another circuit of a subsequent stage as a signal.

Each of the phase-inversion elements has a structure in which at least one p-channel transistor and at least one n-channel transistor whose gate electrodes are connected to each other are connected in series between a VDD and a VSS.

One of electrodes of the capacitor is connected to a node to which a potential of the signal is supplied, so that data of the signal input to the memory element can be stored as needed. The other electrode is connected to the capacitor switching element.

In the state where a power supply voltage is applied between the VDD and the VSS, when the signal including the data is input to the input terminal of the first phase-inversion element, the data is held by the first phase-inversion element and the second phase-inversion element. Before the application of the power supply voltage is stopped, the capacitor switching element is turned on, so that data of the signal is stored in the capacitor. With the above-described structure, even when the application of the power supply voltage to the phase-inversion elements is stopped, data can be held in the memory element.

A channel formation region of a transistor which is used as the capacitor switching element may include amorphous silicon, polysilicon, microcrystalline silicon, or a compound semiconductor (e.g., highly-purified oxide semiconductor). In addition, the channel is sufficiently long; thus, the amount of off-state current is extremely small.

On the other hand, in a transistor used in the phase-inversion element, an amorphous, microcrystalline, polycrystalline, or single crystal semiconductor can be used. As a material of such a semiconductor, silicon, gallium arsenide, gallium phosphide, germanium, or the like can be given. In addition, for manufacturing the above-described transistor, a thin semiconductor film or a bulk semiconductor (semiconductor wafer) may be used.

Note that an oxide semiconductor preferably contains at least indium (In) or zinc (Zn). In particular, In and Zn are preferably contained. As a stabilizer for reducing variation in electric characteristics of a transistor using the oxide semiconductor, gallium (Ga) is preferably contained additionally. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), a Sn—Ga—Zn-based oxide, an Al—Ga—Zn-based oxide, a Sn—Al—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn—O-based oxide" means an oxide containing In, Ga, and Zn as its main component and there is no particular limitation on the ratio of In to Ga and Zn. The In—Ga—Zn-based oxide may contain a metal element other than the In, Ga, and Zn. The above oxide semiconductor may contain silicon, sulfur, nitrogen, or the like.

Alternatively, an oxide semiconductor which can be represented by the chemical formula, $InMO_3(ZnO)_m$ (m>0) can be used. Here, M denotes one or more metal elements selected from Sn, Ga, Al, Hf, and Co.

For example, an In—Ga—Zn-based oxide with an atomic ratio where In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In—Sn—Zn-based oxide with an atomic ratio where In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn oxide. However, the mobility can be increased by reducing the defect density in the bulk also in the case of using the In—Ga—Zn-based oxide.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In the case where an oxide semiconductor is in an amorphous state, a flat surface can be obtained with relative ease. Thus, when a transistor is manufactured with use of such an oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, further preferably less than or equal to 0.1 nm.

The oxide semiconductor is a metal oxide having a relatively high mobility (greater than or equal to 1 cm$^2$/Vs, preferably greater than or equal to 10 cm$^2$/Vs) as semiconductor characteristics. In addition, an oxide semiconductor which is highly purified by reducing an impurity such as moisture or hydrogen and oxygen vacancies serving as electron donors (donor) (the oxide semiconductor is "purified OS") is an i-type semiconductor (intrinsic semiconductor, in this specification, a semiconductor having a carrier concentration of $1 \times 10^{12}$/cm$^3$ or lower is called i-type semiconductor) or a semiconductor extremely close to an i-type semiconductor (a substantially i-type semiconductor).

Specifically, impurities such as moisture or hydrogen included in the oxide semiconductor are removed so that the value of the hydrogen concentration in the oxide semiconductor measured by secondary ion mass spectrometry (SIMS) can be lower than or equal to $5 \times 10^{19}$/cm$^3$, preferably lower than or equal to $5 \times 10^{18}$/cm$^3$, further preferably lower than or equal to $5 \times 10^{17}$/cm$^3$, still further preferably lower than or equal to $1 \times 10^{16}$/cm$^3$. In addition, oxygen vacancies are reduced as much as possible. The removal of an element which is undesirable for formation of an intrinsic oxide semiconductor means high purification.

With the above-described structure, the carrier density of an oxide semiconductor film, which can be measured by Hall effect measurement, can be lower than $1 \times 10^{14}$/cm$^3$, preferably less than $1 \times 10^{12}$/cm$^3$, further preferably less than $1 \times 10^{11}$/cm$^3$ that is a value less than or equal to measurement limit. That is, the carrier density of the oxide semiconductor film can be extremely close to zero.

Further, the bandgap of the used oxide semiconductor is greater than or equal to 2 eV and less than or equal to 4 eV, preferably greater than or equal to 2.5 eV and less than or equal to 4 eV, further preferably greater than or equal to 3 eV and less than or equal to 4 eV. By using a highly purified oxide semiconductor film with the wide bandgap as described and sufficiently reduced impurities such as moisture or hydrogen and oxygen vacancies, the off-state current of the transistor can be reduced.

The analysis of the concentrations of hydrogen in the oxide semiconductor film and a conductive film is described here. Measurements of the hydrogen concentration in the oxide semiconductor film and the hydrogen concentration in the conductive film are performed by SIMS. It is known that it is difficult to obtain accurate data in the proximity of a surface of a sample or in the proximity of an interface between stacked films formed using different materials, by the SIMS in principle.

Thus, in the case where distribution of the hydrogen concentrations in the film in a thickness direction is analyzed by SIMS, an average value in a region of the film in which the value is not greatly changed and substantially the same value can be obtained is employed as the hydrogen concentration.

Further, in the case where the thickness of the film is small, a region where almost the same value is obtained cannot be found in some cases due to the influence of the hydrogen concentration of the films adjacent to each other. In this case, the maximum value or the minimum value of the hydrogen concentration of a region where the film is provided is employed as the hydrogen concentration of the film. Furthermore, in the case where a mountain-shaped peak indicating the maximal value and a valley-shaped peak indicating the minimal value do not exist in any region of the film, the value of the inflection point is employed as the hydrogen concentration.

Note that it is found that the oxide semiconductor film formed by sputtering or the like includes a large amount of impurities such as moisture or hydrogen. Moisture and hydrogen easily form a donor level and thus serve as impurities in the oxide semiconductor.

Therefore, in one embodiment of the present invention, in order to reduce impurities such as moisture or hydrogen in the oxide semiconductor film, the oxide semiconductor film is subjected to heat treatment in a reduced pressure atmosphere, an atmosphere of an inert gas such as nitrogen or a rare gas, an oxygen gas atmosphere, or an ultra dry air atmosphere (the moisture amount is less than or equal to 20 ppm (−55° C. by conversion into a dew point), preferably less than or equal to 1 ppm, further preferably less than or equal to 10 ppb, in the case where measurement is performed with use of a dew point meter of a cavity ring down laser spectroscopy (CRDS) system).

The above heat treatment is preferably performed at a temperature from 300° C. to 850° C. inclusive, further preferably from 550° C. to 750° C. inclusive. Note that this heat treatment is performed at a temperature not exceeding the allowable temperature limit of the substrate to be used. An effect of elimination of moisture or hydrogen by the heat treatment has been confirmed by thermal desorption spectrometry (TDS).

A furnace or a rapid thermal annealing method (RTA method) is used for the heat treatment. As the RTA method, a method using a lamp light source or a method in which heat treatment is performed for a short time while a substrate is moved in a heated gas can be employed. By the use of the RTA method, it is also possible to make the time necessary for heat treatment shorter than 0.1 hours.

Specifically, the transistor including the oxide semiconductor film that is highly purified by the above heat treatment or the like as an active layer has an extremely small amount of off-state current (extremely high off-resistance). Specifically, even when an element has a channel width (W) of $1 \times 10^6$ μm (a channel length (L) of 1 μm), the off-state current (drain current when the voltage between a gate electrode and a source electrode is lower than or equal to 0 V) at a drain voltage (voltage between the source electrode and the drain electrode) of 1 V can be lower than or equal to the measurement limit of a semiconductor parameter analyzer, i.e., less than or equal to $1 \times 10^{-13}$ A.

In this case, the off-state current density (off-state current per micrometer of the channel width) is less than or equal to 100 zA/μm. In the transistor having a long and narrow channel, the off-state current is less than or equal to 1 zA. Accordingly, the transistor including the highly-purified oxide semiconductor film as an active layer has an extremely smaller amount of off-state current than a transistor including silicon having crystallinity.

By using the transistor having the above structure as a capacitor switching element for controlling release of electric charge stored in the capacitor, leakage of electric charge from the capacitor can be prevented; therefore, even without application of power supply voltage, data is not erased but can be held. In a period during which data is held in the capacitor, the power supply voltage is not necessarily supplied to the phase-inversion elements; as a result, surplus power consumption due to the off-state current of transistors used for the phase-inversion elements can be reduced, and the power consumption of the memory device and further the signal processing circuit including the memory device can be suppressed to be low.

Note that the off-state current of the capacitor switching element is determined depending on capacitance of the capacitor and a period of time for holding data. For example, in the case where a transistor including a highly purified oxide semiconductor is used for the capacitor switching element, the off-state current can be less than or equal to 1 zA when the drain voltage is 1 V as described above. For example, when the capacitance of the capacitor is 1 fF, data can be held for one day or longer.

In some cases, a long period of time is not needed for holding data. For example, in the case of holding data for only a second, the off-state current may be less than or equal to 0.1 fA on the assumption that the capacitance of the capacitor is 1 fF.

Unlike the case of using a highly purified oxide semiconductor, a small off-state current less than or equal to 1 zA cannot be achieved by using amorphous silicon, polysilicon, microcrystalline silicon, or the like. However, the off-state current can be reduced to 0.1 fA or less by forming a long and narrow channel or reducing a thickness of a semiconductor layer as described in Patent Document 1.

Note that the amount of off-state current is proportional to the mobility of the semiconductor; thus, the lower the mobility is, the more reduced the off-state current is. Therefore, the off-state current in a transistor including amorphous silicon is smaller than that of a transistor including polysilicon. A transistor including a semiconductor with low mobility has inferior switching performance, which is hardly problematic in one embodiment of the present invention. Descriptions thereof will be made later.

By applying the memory element having the above structure to a memory device such as a register or a cache memory included in a signal processing circuit, data in the memory device can be prevented from being erased owing to the stop of the power supply. Therefore, the power supply can be stopped even for a short time in the signal processing circuit or one or a plurality of logic circuits included in the signal processing circuit. Accordingly, it is possible to provide a signal processing circuit whose power consumption can be suppressed and a method for driving the signal processing circuit whose power consumption can be suppressed.

However, the operations of stopping and resuming supply of power may be extremely slow operation as compared with the clock speed of a logic circuit. In other words, a period of 100 microseconds is enough for a switching operation, and in some cases, the switching time may be a millisecond or longer. This is because a process in which data held in a flip-flop circuit of each memory element is transferred to the capacitor or a process in which data held in the capacitor is transferred to the flip-flop circuit of each memory element can be conducted simultaneously in all the memory elements. Such a low-speed operation causes no defect even in a transistor with a long and narrow channel. The mobility of a semiconductor may be 1 cm$^2$/Vs or higher.

In general, there is a relation between the on-current to $I_{on}$ to the off-state current $I_{off}$ and the time $\tau_{on}$ needed for switching operation to the time $\tau_{off}$ for holding data as follows:

$$\frac{\tau_{off}}{\tau_{on}} \sim \frac{I_{on}}{I_{off}} \times \frac{1}{100}$$

Thus, when the on-state current $I_{on}$ is 10$^8$ times as large as the off-state current $I_{off}$, $\tau_{off}$ is approximately 10$^6$ times as large as $\tau_{on}$.

For example, in the case where a time necessary for the capacitor switching element to inject electric charge to the capacitor is a microsecond, the capacitor and the capacitor switching element can hold data for a second. If a period during which data is held is longer than a second, an operation in which the held data is returned to the phase-inversion element, amplified, and then captured in the capacitor (this operation is called refresh) may be repeated every second.

Further, in the capacitor, as the capacitance is high, an error at the time of returning data to the flip-flop circuit is less likely to occur. In contrast, when the capacitance is high, the response speed of a circuit including the capacitor and the capacitor switching element is decreased. However, the operation of stopping and resuming supply of power may be extremely slow operation as compared with the clock speed of a logic circuit as described above. Thus, there is no problem when the capacitance is less than or equal to 1 pF.

Note that, as in a DRAM, generally, it is difficult to form a capacitor with a larger capacitance. However, according to one embodiment of the present invention, a capacitor may be formed over a phase-inversion element with an area of 50 F$^2$ or more; thus, formation of the capacitor is much easier than that in the DRAM in which a capacitor is formed in an area of 8 F$^2$ or less. A planar capacitor which can be formed without a special manufacturing method may be employed.

Furthermore, when a transistor used for the capacitor switching element has a long and narrow channel, the off-state current of the transistor can be reduced, and influence of the parasitic capacitance formed by wirings can be small. Thus, the capacitance of the capacitor may be much lower than that used in a DRAM (about 30 fF).

Note that when electric charge is drastically transferred from the phase-inversion element to the capacitor, stability of the phase-inversion elements is decreased and accordingly data stored in the phase-inversion element may be corrupted. In such a case, wrong data is held in the capacitor.

In order to prevent the above problem, the on-state current of the capacitor switching element may be reduced to some extent. A transistor with a long and narrow channel or a transistor with a mobility of 10 cm$^2$/Vs or lower, as described above, is suitable for this purpose.

According to one embodiment of the present invention, data can be transferred and held in the capacitor, and supplying power of the memory element can be stopped. Thus, the threshold value of a transistor used for the phase-inversion element in the memory element may be reduced. That is, a memory element which operates at high speed and consumes less power can be obtained.

Note that in the above structure, one of electrodes of the capacitor is connected to the phase-inversion element, and the other electrode is connected to the capacitor switching element. With such a structure, a gate potential of the capacitor switching element does not influence the phase-inversion element when the capacitor switching element is turned on. Thus, even when the capacitor switching element has a long channel and accordingly the gate capacitance thereof is larger than capacitance of the capacitor, the node of the phase-inversion element is not affected by the gate potential of the capacitor switching element. For example, the amount of gate capacitance of the capacitor switching element can be five times as large as the amount of capacitance of the capacitor or more.

DETAILED DESCRIPTION OF THE INVENTION

Figure 1A:
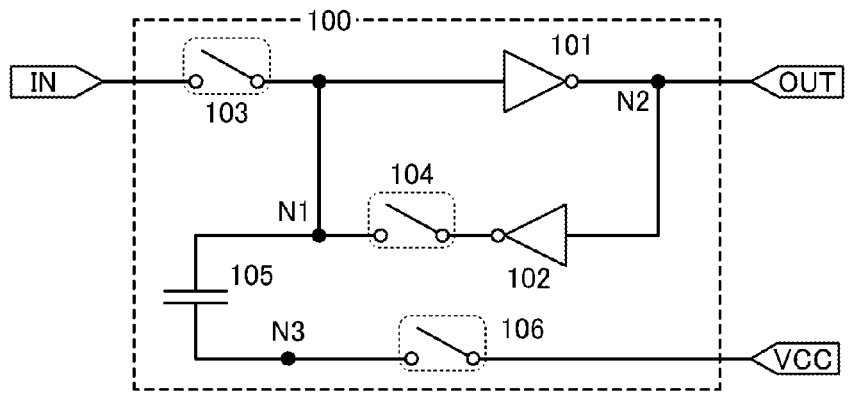
FIGS. 1A and 1B are circuit diagrams of a memory element.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the description in the following embodiments.

Note that "connection" in this specification means electrical connection and corresponds to the state in which current, voltage, or potential can be supplied, applied, or conducted. Therefore, a state of electrical connection means not only a state of direct connection but also a state of indirect connection through a circuit element such as a wiring, or a resistor, in which current, voltage, or a potential can be supplied or transmitted.

Note also that even when a circuit diagram shows independent components as if they are connected to each other, there is a case in which one conductive film has functions of a plurality of components such as a case in which part of a wiring also functions as an electrode. The term "connection" in this specification also means such a case where one conductive film has functions of a plurality of components.

The names of the "source electrode" and the "drain electrode" included in the transistor interchange with each other depending on the polarity of the transistor or difference between the levels of potentials applied to the respective electrodes. In general, in an n-channel transistor, an electrode to which a lower potential is supplied is called a source electrode, whereas an electrode to which a higher potential is supplied is called a drain electrode. In a p-channel transistor, an electrode with a low potential is called a drain electrode, whereas an electrode with a high potential is called a source electrode.

In this specification, for convenience, although connection relation of the transistor is described assuming that the source electrode and the drain electrode are fixed in some cases; however, actually, the names of the source electrode and the drain electrode interchange with each other depending on relation between the above potentials.

Note that in this specification, the state in which the transistors are connected to each other in series means the state in which only one of a source electrode and a drain electrode of a first transistor is connected to only one of a source electrode and a drain electrode of a second transistor. In addition, the state in which the transistors are connected to each other in parallel means the state in which one of a source electrode and a drain electrode of a first transistor is connected to one of a source electrode and a drain electrode of a second transistor and the other of the source electrode and the drain electrode of the first transistor is connected to the other of the source electrode and the drain electrode of the second transistor.

A signal processing circuit of the present invention includes, but is not limited to, in its category an integrated circuit such as a large scale integrated circuit (LSI) including a microprocessor, an image processing circuit, a digital signal processor (DSP), or a microcontroller.

(Embodiment 1)

A memory device which is one embodiment of the present invention includes one or a plurality of memory elements capable of storing 1-bit data. In FIG. 1A, an example of a circuit diagram of a memory element included in a memory device of the present invention is illustrated. A memory element 100 illustrated in FIG. 1A at least includes a first phase-inversion element 101 and a second phase-inversion element 102 by which the phase of an input signal is inverted and the signal is output, a switching element 103, a switching element 104, a capacitor 105, and a capacitor switching element 106.

A signal IN including data that is input to the memory element 100 is supplied to an input terminal of the first phase-inversion element 101 via the switching element 103. An output terminal of the first phase-inversion element 101 is connected to an input terminal of the second phase-inversion element 102. An output terminal of the second phase-inversion element 102 is connected to the input terminal of the first phase-inversion element 101 via the switching element 104.

A potential of the output terminal of the first phase-inversion element 101 or the input terminal of the second phase-inversion element 102 is output to a memory element or another circuit of a subsequent stage as a signal OUT. Here, a node of the input terminal of the first phase-inversion element 101 is denoted by a first node N1, and a node of the output terminal of the first phase-inversion element 101 is denoted by a second node N2.

Note that in FIG. 1A, an example in which inverters are used as the first phase-inversion element 101 and the second phase-inversion element 102 is illustrated; however, a clocked inverter can also be used as the first phase-inversion element 101 or the second phase-inversion element 102 besides the inverter.

The capacitor 105 is connected to an input terminal of the memory element 100, i.e., the first node N1 to which a potential of the signal IN is supplied, so that the data of the signal IN that is input to the memory element 100 can be stored as needed. Specifically, the capacitor 105 includes a dielectric body between a pair of electrodes. One of the pair of electrodes is connected to the first node N1, and the other electrode is connected to one of electrode of the capacitor switching element 106. A node to which the capacitor 105 and the capacitor switching element 106 are connected is denoted by a third node N3.

The other electrode of the capacitor switching element 106 is connected to a node to which a potential VCC is supplied.

For the capacitor switching element 106, a transistor including a highly purified oxide semiconductor in a channel formation region is used.

Note that the memory element 100 may further include another circuit element such as a diode, a resistor, an inductor, or a capacitor, as needed.

Figure 1B:
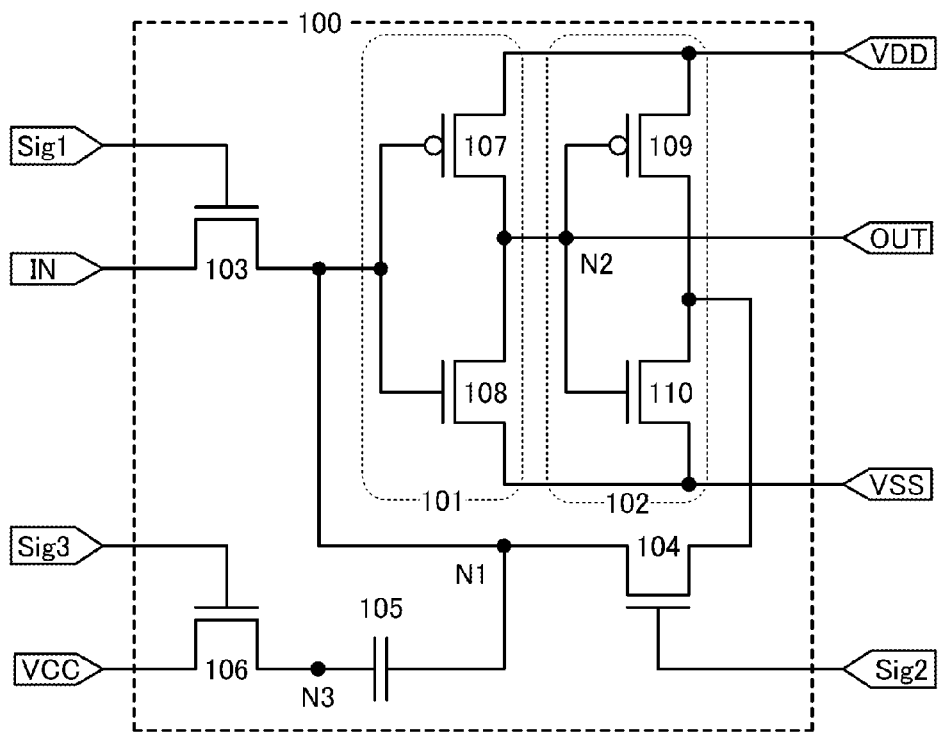
Figure 2A:
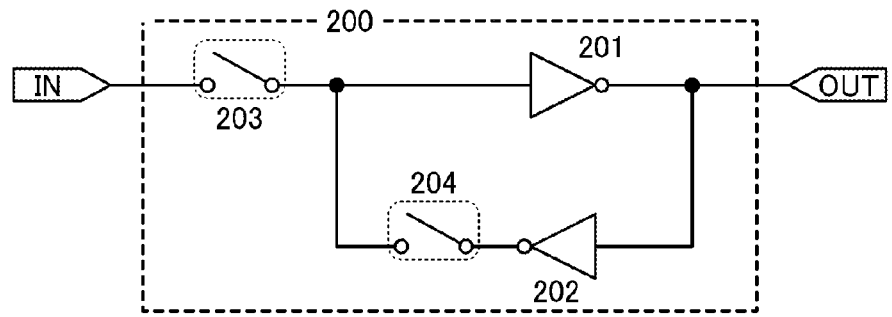
FIGS. 2A and 2B are circuit diagrams of a conventional memory element.
Figure 2B:
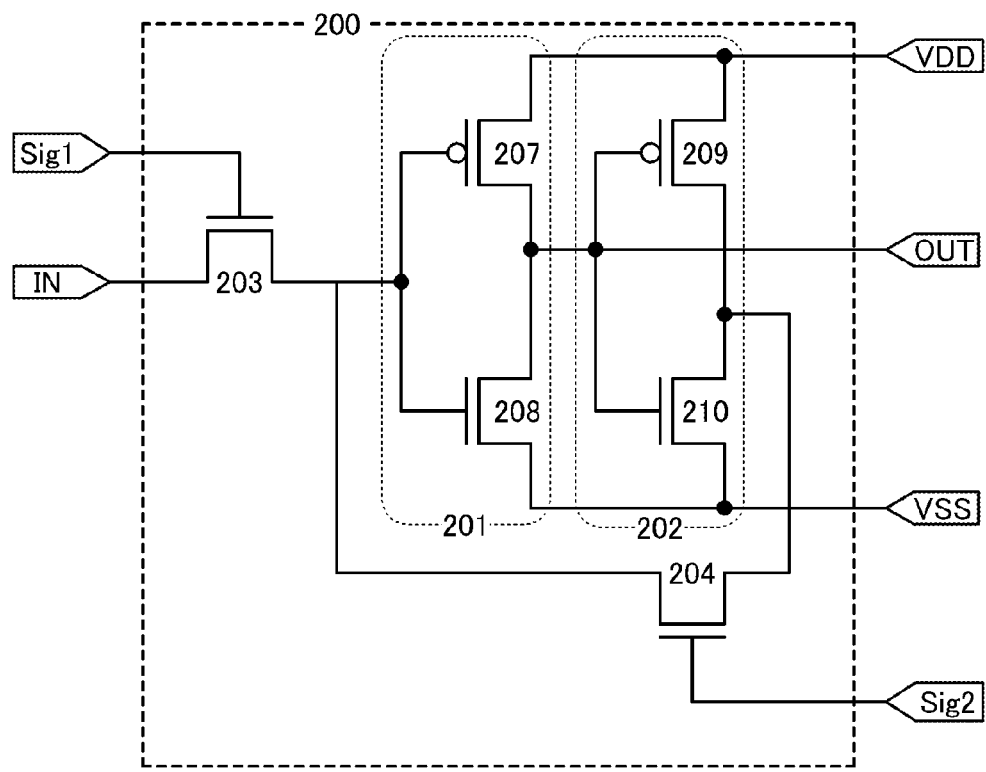

Next, an example of a more specific circuit diagram of the memory element of FIG. 1A is illustrated in FIG. 1B. The memory element 100 illustrated in FIG. 1B includes the first phase-inversion element 101, the second phase-inversion element 102, the switching element 103, the switching element 104, the capacitor 105, and the capacitor switching element 106. The connection structure of these circuit elements are the same as that in FIG. 1A.

The first phase-inversion element 101 in FIG. 1B has a structure in which a p-channel transistor 107 and an n-channel transistor 108 whose gate electrodes are connected to each other are connected in series between a VDD and a VSS. Specifically, a source electrode of the p-channel transistor 107 is connected to the VSS, and a source electrode of the n-channel transistor 108 is connected to the VDD. In addition, a drain electrode of the p-channel transistor 107 is connected to a drain electrode of the n-channel transistor 108, and potentials of the two drain electrodes can be regarded as a potential of the output terminal of the first phase-inversion element 101. In addition, potentials of the gate electrode of the p-channel transistor 107 and the gate electrode of the n-channel transistor 108 can be regarded as a potential of the input terminal of the first phase-inversion element 101.

The second phase-inversion element 102 in FIG. 1B has a structure in which a p-channel transistor 109 and an n-channel transistor 110 whose gate electrodes are connected to each other are connected in series between the VDD and the VSS. Specifically, a source electrode of the p-channel transistor 109 is connected to the VDD, and a source electrode of the n-channel transistor 110 is connected to the VSS. In addition, a drain electrode of the p-channel transistor 109 is connected to a drain electrode of the n-channel transistor 110, and potentials of the two drain electrodes can be regarded as a potential of the output terminal of the second phase-inversion element 102. In addition, potentials of the gate electrode of the p-channel transistor 109 and the gate electrode of the n-channel transistor 110 can be regarded as a potential of the input terminal of the second phase-inversion element 102.

In FIG. 1B, the case where one transistor is used for the switching element 103 is illustrated as an example, and the switching of the transistor is controlled by a signal Sig. 1 supplied to a gate electrode thereof. In addition, the case where one transistor is used for the switching element 104 is illustrated as an example, and the switching of the transistor is controlled by a signal Sig. 2 supplied to a gate electrode thereof Note that in FIG. 1B, a structure in which each of the switching element 103 and the switching element 104 includes only one transistor is illustrated; however, the present invention is not limited to this structure. In one embodiment of the present invention, the switching element 103 or the switching element 104 may include a plurality of transistors.

In the case where a plurality of transistors which serve as switching elements are included in the switching element 103 or the switching element 104, the plurality of transistors may be connected to each other in parallel, in series, or in combination of parallel connection and series connection.

In the case where a plurality of transistors are connected in parallel, polarity thereof may be different. For example, a so-called transfer gate structure in which an n-channel transistor and a p-channel transistor are connected in parallel may be employed.

In FIG. 1B, a transistor including an oxide semiconductor in a channel formation region is used for the capacitor switching element 106, and the switching of the transistor is controlled by a signal Sig. 3 supplied to a gate electrode thereof. The transistor used for the capacitor switching element 106 includes a highly purified oxide semiconductor in the channel formation region. The channel length is ten times as large as the minimum feature size or more, preferably 20 times as large as the minimum feature size or more, further preferably 50 times as large as the minimum feature size or more, or larger than or equal to 1 μm. Therefore, the off-state current of the transistor is extremely small as described above.

In FIG. 1B, a structure in which the capacitor switching element 106 includes only one transistor is illustrated; however, the present invention is not limited to this structure. In one embodiment of the present invention, the capacitor switching element 106 may include a plurality of transistors. In the case where a plurality of transistors which serve as switching elements are included in the capacitor switching element 106, the plurality of transistors may be connected to each other in parallel, in series, or in combination of parallel connection and series connection.

In this embodiment, at least a transistor used for a switching element in the capacitor switching element 106 may include a highly purified oxide semiconductor in a channel formation region.

The transistors used for the first phase-inversion element 101, the second phase-inversion element 102, the switching element 103, and the switching element 104 can include a semiconductor other than an oxide semiconductor, e.g., an amorphous, microcrystalline, polycrystalline, or single crystal semiconductor can be used. As a material of such a semiconductor, silicon, germanium, gallium arsenide, gallium phosphide, indium phosphide, or the like can be given. Further, for manufacturing such transistors, a thin semiconductor film or a bulk (semiconductor wafer) may be used.

Figure 7A:
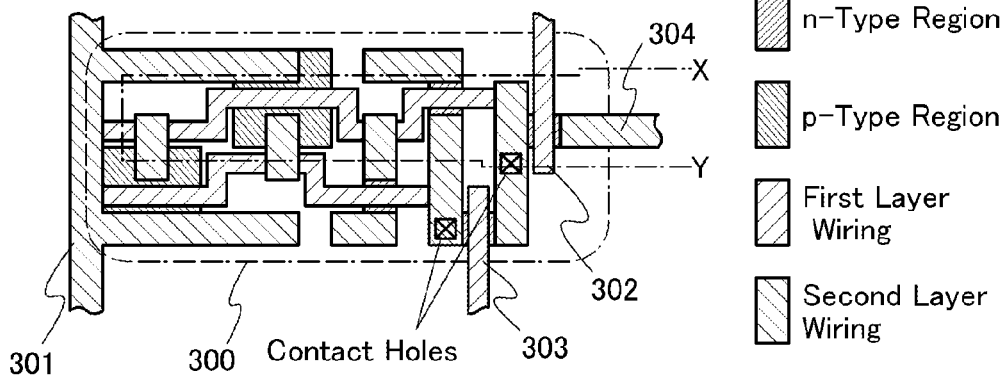
FIGS. 7A to 7D are top views illustrating a structure of a memory element.

An example of circuit arrangement of a memory element in this embodiment is described with reference to FIGS. 7A to 7D. FIG. 7A illustrates a layout of one memory element 300 in a general register. The memory element 300 corresponds to the memory element 100 in FIGS. 1A and 1B. An inverter or the like which is a main component of the memory element 300 may be formed by using a known semiconductor technique. On a semiconductor wafer, an insulator for element isolation (element isolation region), an n-type region, and a p-type region are formed. A first layer wiring which serves as a gate layer is formed thereover, and then a second wiring layer is further formed thereover.

A part of the first layer wiring is a Sig. 1 wiring 302 for supplying a signal Sig. 1, and another part thereof is a Sig. 2 wiring 303 for supplying a signal Sig. 2. A part of the second layer wiring is a VDD wiring 301 connected to a VDD, and a part thereof is an IN wiring 304 for inputting a signal IN. In FIG. 7A, positions of contact holes through which wirings are connected to the upper component are shown. Note that in a circuit using a single crystal semiconductor wafer, a VSS may be connected to the semiconductor wafer.

Figure 7B:
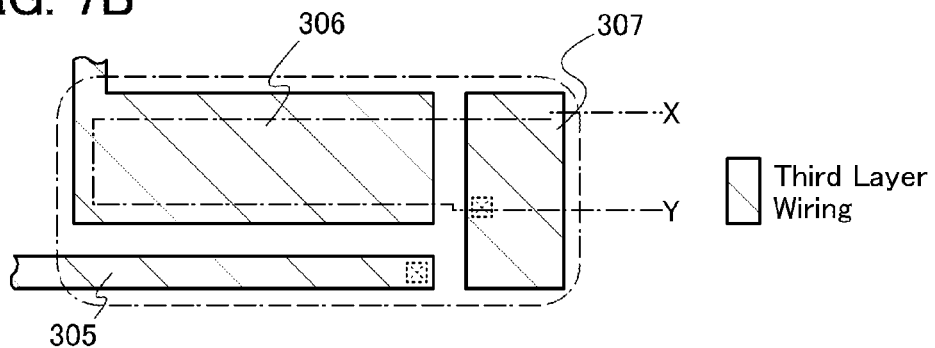

Further, as illustrated in FIG. 7B, a third layer wiring is provided over the structure of FIG. 7A, and a part of the third layer wiring is connected to a part of the second wiring layer through the contact hole, which serves as an OUT wiring 305 for outputting a signal OUT. The other parts of the third layer wiring function as a gate wiring 306 of a transistor as a switching element including an oxide semiconductor and a first capacitor electrode 307.

The gate wiring 306 may be formed to overlap with an area greater than or equal to 80% of an oxide semiconductor region 308 formed later, preferably an area greater than or equal to 85% thereof, further preferably greater than or equal to 90% thereof. A part of the gate wiring 306 serves as a gate electrode of the capacitor switching element 106 illustrated in FIGS. 1A and 1B. Note that the signal Sig. 3 is supplied to the gate wiring 306.

The first capacitor electrode 307 is connected to a part of the second layer wiring (an input terminal or an output terminal of the inverter) through the contact hole. The first capacitor electrode 307 serves as a part of an electrode of an element which is formed in a later step and corresponds to the capacitor 105 in FIGS. 1A and 1B.

Figure 7C:
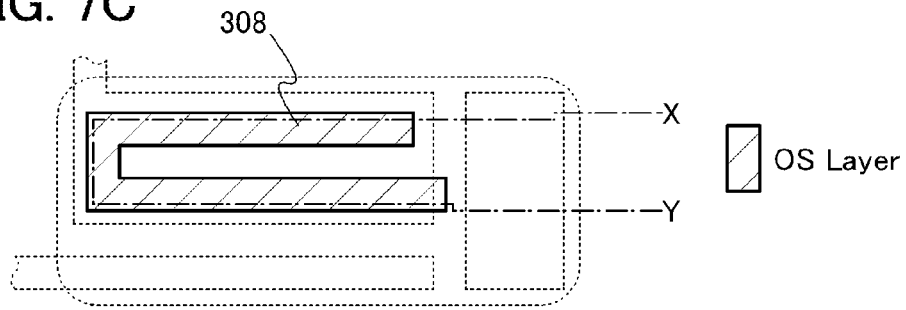

Over the third layer wiring, an oxide semiconductor layer (OS layer) is formed. As illustrated in FIG. 7C, the oxide semiconductor layer has at least one hollow portion and thus has the oxide semiconductor region 308 with a U-shape, for example. Alternatively, the oxide semiconductor region 308 may have a J-shape, an L-shape, a V-shape, or a C-shape. Further alternatively, a shape having two or more hollow portions (e.g., an M-shape, an N-shape, an S-shape, a W-shape, a Z-shape, or the like), or a bent (or winding) shape other than the above may be employed.

As a general definition, on the assumption that a typical length of one memory element is defined as the square root of the area of the memory element, the length from one end portion to the other end portion of the oxide semiconductor region 308 is greater than or equal to the typical length, preferably twice as large as the typical length or more, further preferably five times as large as the typical length or more. Alternatively, the length of the periphery of the oxide semiconductor region 308 is twice as large as the typical length or more, preferably four times as large as the typical length or more, further preferably ten times as large as the typical length or more. Alternatively, a value obtained by dividing the area of the oxide semiconductor region 308 by the length of the periphery may be 0.1 times or less as large as the typical length.

With the above shape, the length from one end portion to the other end portion of the oxide semiconductor region 308 can be larger than the long side of the memory element 300. For example, given that the minimum feature size is F, the length from one end portion to the other end portion can be 10 F or more, preferably 20 F or more, further preferably 50 F or more. In a transistor (corresponding to the capacitor switching element 106 in FIGS. 1A and 1B) which is formed using the oxide semiconductor region 308 with the above shape, the channel length can be 10 F or more, preferably 20 F or more, further preferably 50 F or more. In the case of FIG. 7C, the length from one end portion to the other end portion of the oxide semiconductor region 308 is approximately 22 F.

Figure 7D:
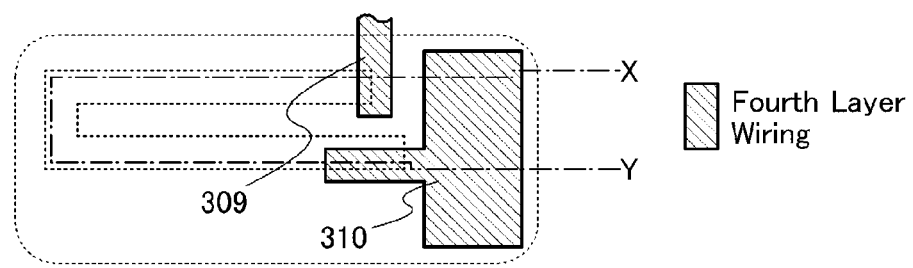

Over the oxide semiconductor layer, a fourth layer wiring is provided as illustrated in FIG. 7D. A source wiring 309 and a second capacitor electrode 310 are formed of the fourth layer wiring. The source wiring 309 is in contact with one end portion of the oxide semiconductor region 308, which functions as a source electrode of a transistor formed in the oxide semiconductor region.

The second capacitor electrode 310 partly overlaps with the first capacitor electrode 307 to form a part of the capacitor 105 in FIGS. 1A and 1B. In the case of FIG. 7D, the area of electrodes of the capacitor (an area where two electrodes overlap with each other) is 18 $F^2$. Further, the second capacitor electrode 310 is in contact with the other end portion of the oxide semiconductor region 308, which serves as a drain electrode of the transistor to be formed in the oxide semiconductor region.

Figure 8A:
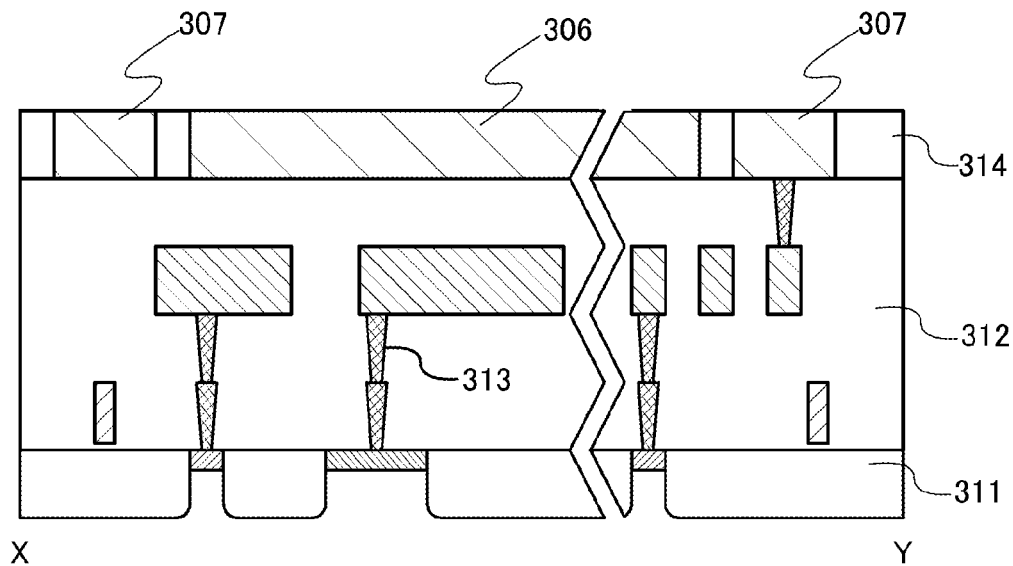
FIGS. 8A and 8B are cross-sectional views illustrating a structure of the memory element.
Figure 8B:
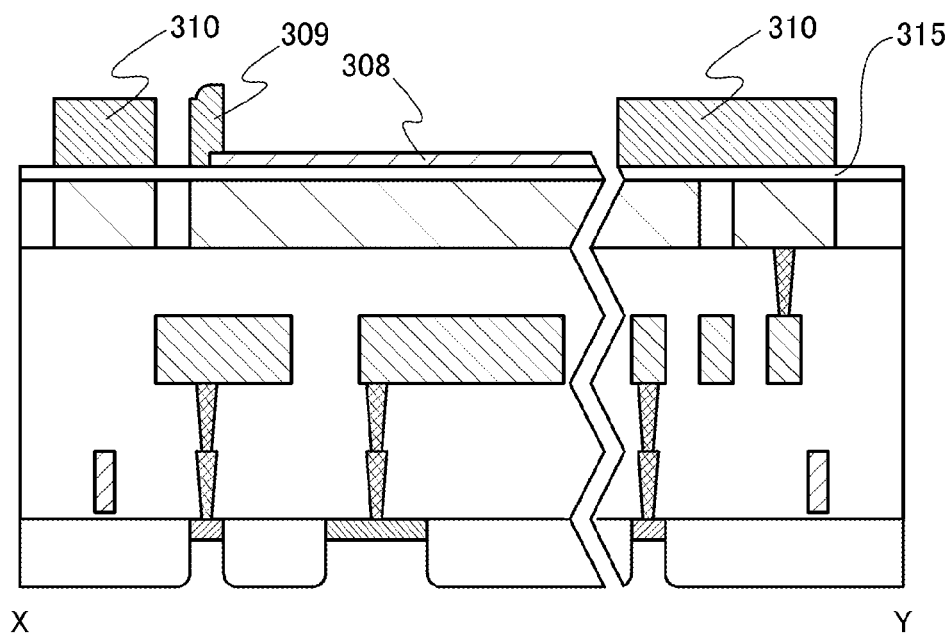

FIGS. 8A and 8B schematically illustrate a cross-sectional structure of the memory element 300 along dashed dotted line X-Y in FIGS. 7A to 7D. Note that in FIGS. 8A and 8B and FIGS. 7A to 7D, the same hatching denotes the same component.

FIG. 8A is a cross-sectional view of a structure in FIG. 7B. An element isolation region 311, the n-type region, and the p-type region are formed in a surface of the semiconductor wafer, and the first layer wiring, and the second layer wiring are provided, so that a circuit is formed. An interlayer insulator 312 is provided over the n-type and p-type regions so that the first layer wiring and the second layer wiring are embedded. In the case where electrical connection between the n-type and p-type regions and the second layer wiring is needed, a contact plug 313 is provided. Further, over the interlayer insulator 312, the gate wiring 306 and the first capacitor electrode 307 formed of the third layer wiring are embedded in an embedding insulator 314.

FIG. 8B is a cross-sectional view of a structure in FIG. 7D. Over the structure illustrated in FIG. 8A, a gate insulator 315, an oxide semiconductor layer (such as the oxide semiconductor region 308), and the fourth layer wiring (the source wiring 309 and the second capacitor electrode 310) are further formed. Here, the thickness of the oxide semiconductor layer is 1 nm to 30 nm, preferably 1 nm to 10 nm, and the thickness of the gate insulator 315 is 2 nm to 30 nm, preferably 5 nm to 10 nm.

Further, as described in Patent Document 3, one or a plurality of materials with a high work function may be provided in contact with the oxide semiconductor layer. With such a structure, the oxide semiconductor layer can be depleted, which is effective in an increase in off-resistance.

In this embodiment, since quality of an oxide semiconductor layer is valued, a highly purified oxide semiconductor (film) may be used. A method for manufacturing such an oxide semiconductor (film) will be described in detail in Embodiment 4.

Next, an example of operation of the memory element illustrated in FIG. 1A is described. Note that the operation of the memory element can be performed by a method other than the following description.

First, in writing data, the switching element 103 is turned on, the switching element 104 is turned off, and the capacitor switching element 106 is turned off. Then, an appropriate power supply voltage is given between the VDD and the VSS.

A potential of the signal N supplied to the memory element 100 is supplied to the input terminal of the first phase-inversion element 101 via the switching element 103, whereby the potential of the output terminal of the first phase-inversion element 101 is a phase-inverted potential at the signal N. Then, the switching element 104 is turned on and the input terminal of the first phase-inversion element 101 is connected to the output terminal of the second phase-inversion element 102, whereby data is written into the first phase-inversion element 101 and the second phase-inversion element 102.

Next, in the case where data is held by the first phase-inversion element 101 and the second phase-inversion element 102, in the state where the switching element 104 remains in an on state and the capacitor switching element 106 remains in an off state, the switching element 103 is turned off. By turning off the switching element 103, the input data is held by the first phase-inversion element 101 and the second phase-inversion element 102. At this time, a state in which the power supply voltage is applied between the VDD and the VSS is maintained.

The potential of the output terminal of the first phase-inversion element 101 reflects the data held by the first phase-inversion element 101 and the second phase-inversion element 102. Therefore, by reading out the potential, the data can be read out from the memory element 100.

Note that in the case where the input data is held by the capacitor 105 in order to reduce power consumption in holding the data, first, the switching element 103 is turned off, the switching element 104 remains in an on state, and the capacitor switching element 106 is turned on. Then, electric charge with an amount corresponding to the value of the data held by the first phase-inversion element 101 and the second phase-inversion element 102 is stored in the capacitor 105, whereby the data is written into the capacitor 105.

After the data is stored in the capacitor 105, the capacitor switching element 106 is turned off, whereby the data stored in the capacitor 105 is held. After the capacitor switching element 106 is turned off, for example, both the potential of the VDD and the potential of VSS are set equal to each other. Note that after the data is stored in the capacitor 105, the switching element 104 may be turned off.

Figure 4A:
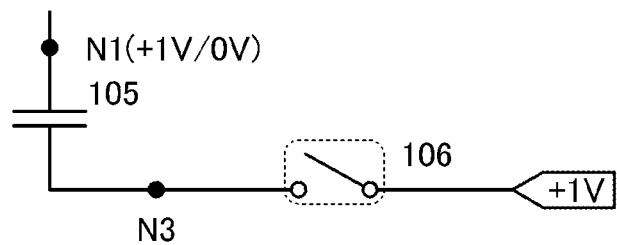
FIGS. 4A to 4D illustrate examples of operation of a memory element.

Change in potential in accordance with the above operation is described with reference to FIGS. 4A to 4D. Here, in a state where the first phase-inversion element 101 and the second phase-inversion element 102 are in an active state, the potential of the VDD and the potential of the VSS are +1 V and 0 V, respectively. At first, the potential of the first node N1 is set to +1 V or 0 V in accordance with data as illustrated in FIG. 4A. Although not illustrated, the potential of the second node N2 is 0 V or +1 V, which is in an inverted phase of the first node N1. Since the capacitor switching element 106 is an off state, the third node N3 is in a floating state. A potential VCC is +1 V.

Figure 4B:
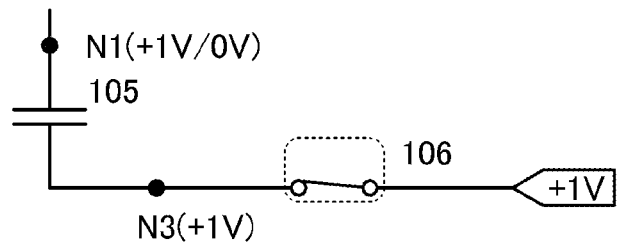

Next, as illustrated in FIG. 4B, the capacitor switching element 106 is turned on, whereby the potential of the third node N3 becomes +1 V. At this time, between the electrodes of the capacitor 105, electric charge corresponding to the difference of potentials of the first node N1 and the third node N3 is accumulated. That is, data is written into the capacitor 105.

Figure 4C:
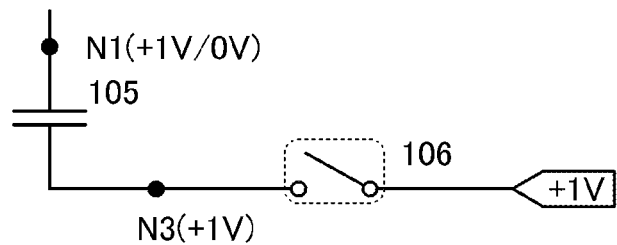

Then, as illustrated in FIG. 4C, the capacitor switching element 106 is turned off, whereby the potential of the third node N3 is kept at +1 V.

Figure 4D:
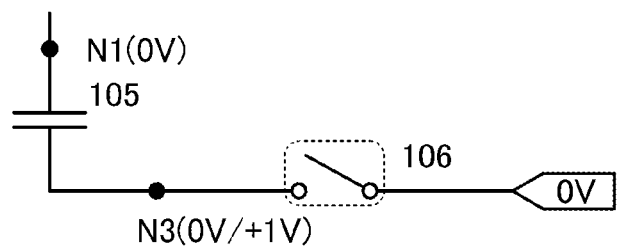

Then, as illustrated in FIG. 4D, the potential of the first node N1 becomes 0 V when both the potential of the VDD and the potential of the VSS are set to 0 V. The potential VCC also becomes 0 V. Accordingly, the potential of the third node N3 becomes 0 V or +1 V in accordance with the written data. In the case where the potential of the first node N1 at the time of writing is +1 V, the third node N3 at this saving stage has a potential of 0 V. In the case where the potential of the first node N1 at the time of writing is 0 V, the potential of the third node at this saving stage is kept at +1 V.

In such a manner, in the case where the input data is held by the capacitor 105, the potential difference between the VDD and the VSS is unnecessary; therefore, the off-state current flowing between the VDD and the VSS via the p-channel transistor 107 and the n-channel transistor 108 which are included in the first phase-inversion element 101, or via the p-channel transistor 109 and the n-channel transistor 110 which are included in the second phase-inversion element 102 can be extremely close to zero. As a result, power consumption due to the off-state current of the memory element in holding the data can be significantly reduced, and the power consumption of the memory device and further the signal processing circuit including the memory device can be suppressed to be low.

Since the transistor used for the capacitor switching element 106 includes a highly-purified oxide semiconductor in a channel formation region, the off-state current density can be less than or equal to 100 zA/μm, preferably less than or equal to 10 zA/μm, further preferably less than or equal to 1 zA/μm.

When the transistor has a long and narrow channel, the off-state current is less than or equal to 1 zA. As a result, when the capacitor switching element 106 for which the transistor is used is in an off state, charge stored in the capacitor 105 is hardly released; therefore, the data is held.

Figure 5A:
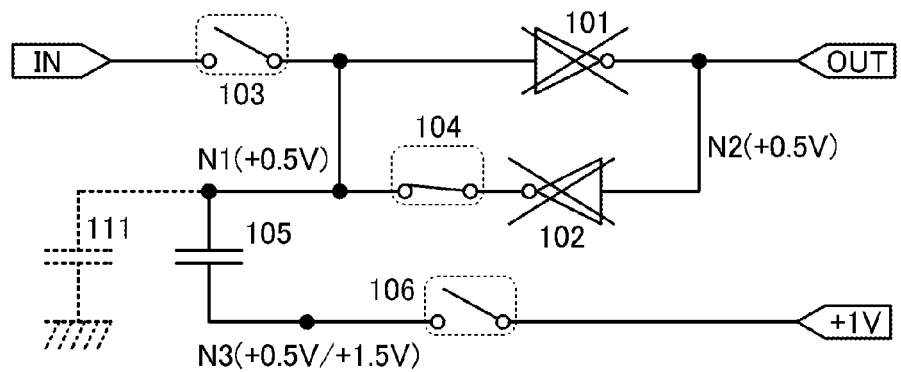
FIGS. 5A to 5C illustrate examples of operation of a memory element.
Figure 5B:
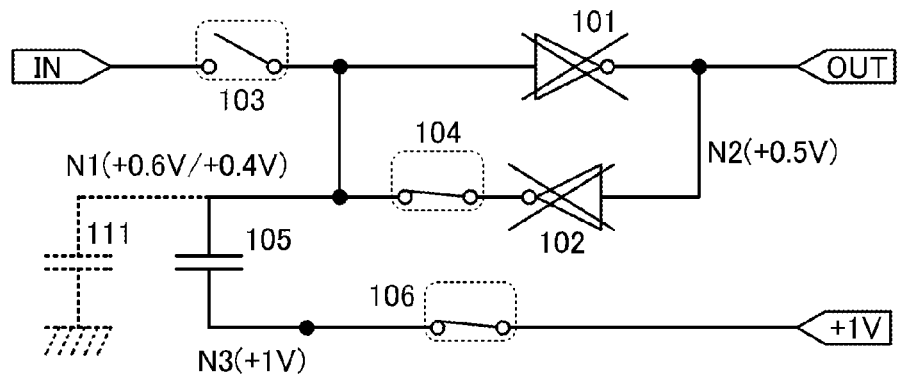
Figure 5C:
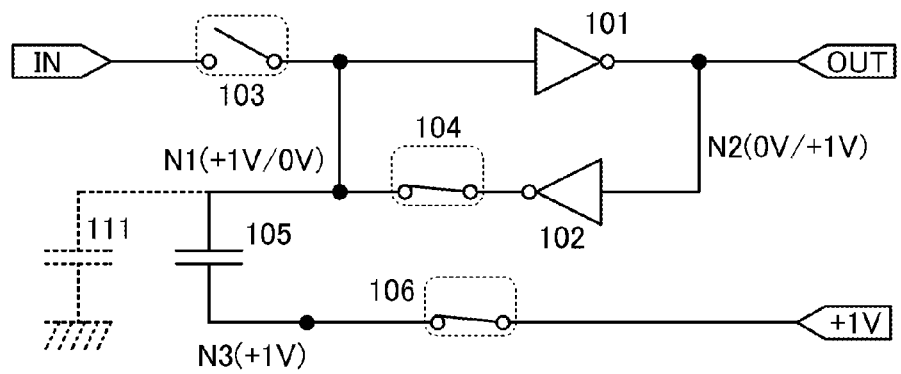

Now, the case where data stored in the capacitor 105 is read is described with reference to FIGS. 5A to 5C. First, the switching element 103 is turned off. In addition, the first phase-inversion element 101 and the second phase-inversion element 102 are set to be in an inactive state. For example, a potential of +0.5 V is preferably applied to each of the VDD and the VSS.

Then, the potentials of the first node N1 and the second node N2 are set to +0.5 V. At this time, there is no difference whether the switching element 104 is in an on state or in an off state. Since the potential of the first node N1 is +0.5 V, the potential of the third node N3 is either +0.5 V or +1.5 V in accordance with the written data. The potential VCC is set to +1 V (see FIG. 5A).

Next, the capacitor switching element 106 is turned on, whereby the potential of the third node N3 becomes +1 V. At this time, the potential of one of electrodes of the capacitor 105 (the electrode on the capacitor switching element 106 side) changes, which leads to a change in the potential of the other electrode. For example, in the case where the potential of the third node N3 is initially +0.5 V, the potential of the third node N3 is increased by turning on the capacitor switching element 106; accordingly, the potential of the other electrode of the capacitor 105 (that is, the first node N1) is increased. In contrast, in the case where the potential of the third node N3 is initially +1.5 V, the potential of the third node N3 is decreased. As a result, the other electrode of the capacitor 105 is decreased.

The degree of an increase or a decrease of potential is determined by the ratio between the capacitance of the capacitor 105 and capacitance of a capacitor 111 including parasitic capacitance of the first node N1. Here, the capacitance of a capacitor 111 including parasitic capacitance is four times the capacitance of the capacitor 105. Thus, the potential of the first node N1 becomes +0.6 V or +0.4 V. That is, the potential of the first node N1 becomes +0.6 V in the case where the potential at the time of writing is +1 V, whereas the potential of the first node N1 becomes +0.4 V in the case where the potential at the time of writing is 0 V (see FIG. 5B).

At this time, the gate capacitance of the capacitor switching element 106 is added to the circuit by turning on the capacitor switching element 106; however, since the capacitor 105 provided between the node N1 and the capacitor switching element 106, the potential of the first node N1 is not directly affected by the gate potential of the capacitor switching element 106 and thus does not fluctuate even when the capacitance is large.

In other words, the potential of the first node N1 is determined without being affected by the gate capacitance or the gate potential of the capacitor switching element 106. Therefore, the capacitance of the capacitor 105 may be smaller than the gate capacitance of the capacitor switching element 106.

Then, the VDD is set to +1 V and the VSS is set to 0 V, whereby the power supply voltage is applied between the VDD and the VSS. At this stage, the switching element 104 is preferably turned on. Thus, the potential difference between the first node N1 and the second node N2 is increased. In other words, in the case where the potential of the first node N1 in the state of FIG. 5B is +0.6 V, the potential of the first node N1 becomes +1 V and the potential of the second node N2 becomes 0 V at this stage. Further, in the case where the potential of the first node N1 in the state of FIG. 5B is +0.4 V, the potential or the first node N1 becomes 0 V and the potential of the second node N2 becomes +1 V. As a result, the state where data is written is restored (see FIG. 5C).

Note that when the amount of capacitance of the capacitor 105 is equal to or larger than the amount of capacitance of the capacitor 111 including parasitic capacitance, data can be restored more easily. For example, when the amount of capacitance of the capacitor 105 is equal to the amount of capacitance of the capacitor 111 including parasitic capacitance, the potential of the first node at the stage of FIG. 5B is +0.75 V or +0.25 V. Thus, for example, the power supply voltage is applied between the VDD and VSS of the first phase-inversion element 101 and the second phase-inversion element 102 while the switching element 104 remains in an off state, whereby a signal can be amplified without malfunction and thus data can be restored.

In the above description, an example of using a thin film transistor using a highly purified oxide semiconductor as the capacitor switching element 106 is described; however, a thin film transistor using amorphous silicon, polysilicon, microcrystalline silicon, or the like can be used.

In such a case, the amount of off-state current is large as compared with that of a thin film transistor using a highly purified oxide semiconductor, and thus a time period during which data is held is short. However, an refresh operation in which data is regularly input/output into/from the first phase-inversion element 101 and the second phase-inversion element 102 and then the data is returned to the capacitor 105 is repeated, whereby holding data can be kept.

Note that in this case, refresh operations of all the memory elements which need to be refreshed can be conducted at the same time, which is different from refresh operation in a DRAM. Thus, time necessary for all the memory elements to perform refresh operation is extremely short as compared with the case in a DRAM. Needless to say, refresh operation may be sequentially performed per block including memory elements where refresh operation is needed.

(Embodiment 2)

Figure 3A:
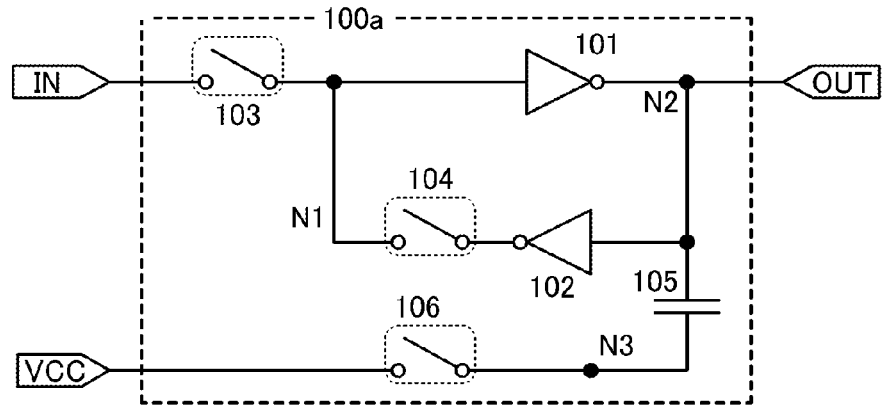
FIGS. 3A to 3C are circuit diagrams of a memory element.
Figure 3B:
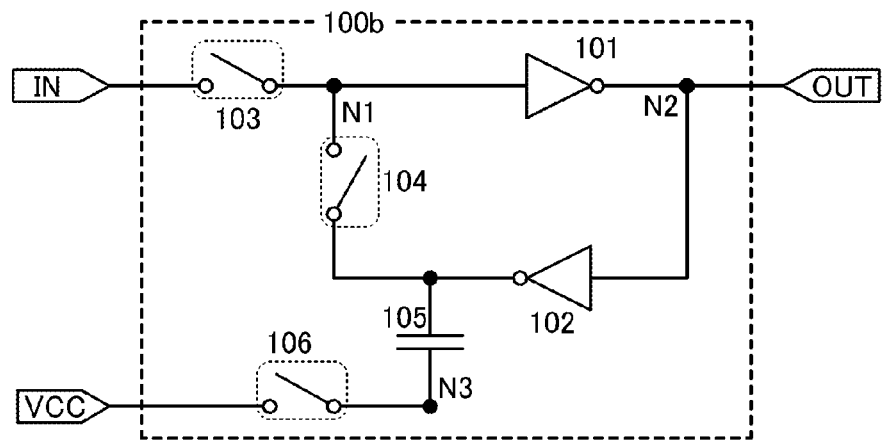

In this embodiment, another example of a memory element included in a memory device of the present invention will be described. Although in the memory element 100 illustrated in FIGS. 1A and 1B, one of the electrodes of the capacitor 105 is connected to the first node N1, the electrode may be connected to another portion. For example, as in a memory element 100a illustrated in FIG. 3A, one of electrodes of a capacitor 105 may be connected to a second node N2. Alternatively, as illustrated in a memory element 100b illustrated in FIG. 3B, one of electrodes of a capacitor 105 may be connected between a switching element 104 and a second phase-inversion element 102. In other words, one of electrodes of the capacitor 105 may be connected to any of the input/output terminals of a first phase-inversion element 101 and a second phase-inversion element 102.

Wiring data and reading data in the above structure may be performed in a manner similar to that described in Embodiment 1. In any structure, the gate capacitance is generated when the capacitor switching element 106 is turned on, but the generation of the gate capacitance does not cause fluctuation of the potential of the third node N3. Thus, the proportion of occurrence of malfunction at the time of reading data can be reduced.

(Embodiment 3)

Figure 3C:
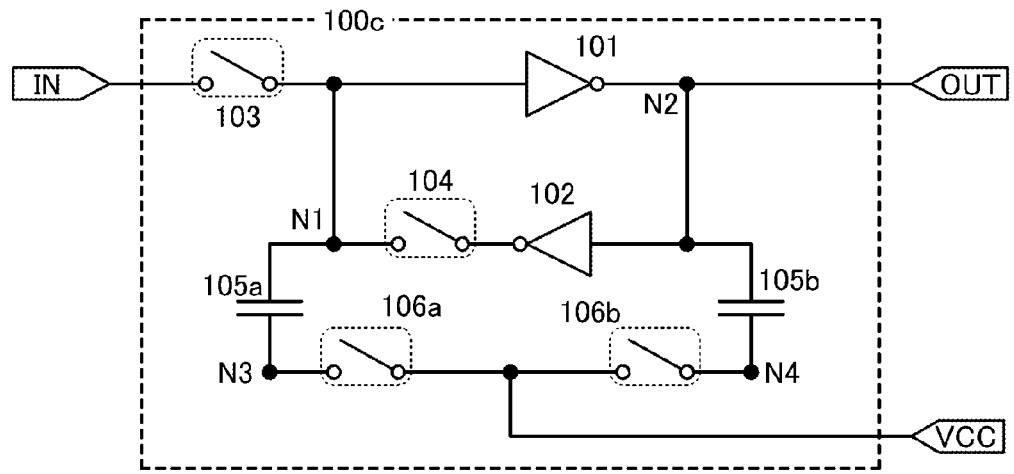

In this embodiment, another example of a memory element included in a memory device of the present invention will be described. In FIG. 3C, a circuit diagram of a memory element of this embodiment is illustrated as an example.

A memory element 100c illustrated in FIG. 3C at least includes a first phase-inversion element 101 and a second phase-inversion element 102 by which the phase of an input signal is inverted and the signal is output, a switching element 103, a switching element 104, a first capacitor 105a, a first capacitor switching element 106a, a second capacitor 105b, and a second capacitor switching element 106b.

A signal IN including data that is input to the memory element 100c is supplied to an input terminal of the first phase-inversion element 101 via the switching element 103. An output terminal of the first phase-inversion element 101 is connected to an input terminal of the second phase-inversion element 102. An output terminal of the second phase-inversion element 102 is connected to the input terminal of the first phase-inversion element 101 via the switching element 104. A potential of the output terminal of the first phase-inversion element 101 or the input terminal of the second phase-inversion element 102 is output to a memory element or another circuit of a fourth subsequent stage as a signal OUT.

One of the electrodes of the first capacitor 105a is connected to an input terminal of the memory element 100c, i.e., a first node N1 to which a potential of the signal IN is supplied, so that the data of the signal IN that is input to the memory element 100c can be stored as needed. The other electrode of the first capacitor 105a is connected to one of electrodes of the first capacitor switching element 106a. The other electrode of the first capacitor switching element 106a is connected to a node to which the potential VCC is supplied.

One of electrodes of the second capacitor 105b is connected to an output terminal of the memory element 100c, i.e., a second node N2 to which a potential of the signal OUT is supplied, so that data of the signal IN that is input to the memory element 100c can be stored as needed. The other electrode of the second capacitor 105b is connected to one of electrodes of the second capacitor switching element 106b. The other electrode of the second capacitor switching element 106b is connected to the node to which the potential VCC is supplied. A node to which the second capacitor 105b and the second capacitor switching element 106b are connected is denoted by a node N4.

Note that in FIG. 3C, an example in which inverters are used as the first phase-inversion element 101 and the second phase-inversion element 102 is illustrated; however, a clocked inverter can also be used as the first phase-inversion element 101 or the second phase-inversion element 102 besides the inverter. Further, nodes where the first capacitor 105a and the second capacitor 105b are connected to the first phase-inversion element 101 and the second phase-inversion element 102 are not limited to the above nodes, and two nodes whose phases are opposite to each other may be employed.

For the first capacitor switching element 106a and the second capacitor switching element 106b, transistors each including a highly purified oxide semiconductor in a channel formation region are used. Like the capacitor switching element 106 described in Embodiment 1, each of the first capacitor switching element 106a and the second capacitor switching element 106b is formed using an oxide semiconductor, above the first phase-inversion element 101 and the second phase-inversion element 102. Each of the channel lengths is greater than or equal to 10 F, preferably greater than or equal to 20 F, further preferably greater than or equal to 50 F, or a micrometer, given that the minimum feature size is F.

Note that the memory element 100c may further include another circuit element such as a diode, a resistor, an inductor, or a capacitor, as needed.

Next, an example of the operation of the memory element illustrated in FIG. 3C will be described. Note that the operation of the memory element can be performed by a method other than the following description. In the following description, in a state where the first phase-inversion element 101 and the second phase-inversion element 102 are in an active state, the potential of the VDD and the potential of the VSS are +1 V and 0 V, respectively.

First, in writing data, the switching element 103 is turned on, the switching element 104 is turned off, the first capacitor switching element 106a is turned off, and the second capacitor switching element 106b is turned off. Then, a power supply voltage is applied between the VDD and the VSS. A potential of the signal IN supplied to the memory element 100c is supplied to the input terminal of the first phase-inversion element 101 via the switching element 103, whereby the potential of the output terminal of the first phase-inversion element 101 is a phase-inverted potential of the signal N. Then, the switching element 104 is turned on and the input terminal of the first phase-inversion element 101 is connected to the output terminal of the second phase-inversion element 102, whereby data is written into the first phase-inversion element 101 and the second phase-inversion element 102.

Next, in the case where data is held by the first phase-inversion element 101 and the second phase-inversion element 102, the switching element 103 is turned off while the switching element 104 remains in an on state, the first switching element 106a remains in an off state, and the second capacitor switching element 106b remains in an off state. By turning off the switching element 103, the input data is held by the first phase-inversion element 101 and the second phase-inversion element 102. At this time, the state where the power supply voltage is applied between the VDD and the VSS is maintained.

The potential of the output terminal of the first phase-inversion element 101 reflects the data held by the first phase-inversion element 101 and the second phase-inversion element 102. Therefore, by reading out the potential, the data can be read out from the memory element 100c.

Note that in the case where the input data is held in the first capacitor 105a and the second capacitor 105b in order to reduce power consumption in holding data, the switching element 103 is turned off, the switching element 104 is turned on, the first capacitor switching element 106a is turned on, and the second capacitor switching element 106b is turned on.

Then, with the first capacitor switching element 106a and the second capacitor switching element 106b, electric charge with an amount corresponding to the value of the data held by the first phase-inversion element 101 and the second phase-inversion element 102 is stored in the first capacitor 105a and the second capacitor 105b, whereby the data is written into the first capacitor 105a and the second capacitor 105b. Embodiment 1 or FIGS. 4A to 4D may be referred to for the details.

Note that the polarity of a voltage between a pair of electrodes included in the first capacitor 105a and the polarity of a voltage between a pair of electrodes included in the second capacitor 105b are opposite to each other.

In addition, after the data is stored in the first capacitor 105a, the first capacitor switching element 106a is turned off, whereby the data stored in the first capacitor 105a is held. In addition, after the data is stored in the second capacitor 105b, the second capacitor switching element 106b is turned off, whereby the data stored in the second capacitor 105b is held. After the first capacitor switching element 106a and the second switching element 106b are turned off, the potentials of the VDD and the VSS are equal to each other by applying 0 V for example.

As described above, in the case where the input data is held by the first capacitor 105a and the second capacitor 105b, it is not necessary that the power supply voltage is applied between the VDD and the VSS; thus, the off-state current flowing between the VDD and the VSS of the first phase-inversion element 101 or the second phase-inversion element 102 can be extremely close to zero. As a result, power consumption due to the off-state current of the memory element in holding the data can be significantly reduced, and the power consumption of the memory device and further the signal processing circuit including the memory device can be suppressed to be low.

Since the transistors used for each of the first capacitor switching element 106a and the second capacitor switching element 106b each include a highly purified oxide semiconductor in a channel formation region, the off-state current density can be less than or equal to 100 zA/μm, preferably less than or equal to 10 zA/μm, further preferably less than or equal to 1 zA/μm.

In the transistor having a long and narrow channel, the off-state current is less than or equal to 1 zA. As a result, when the first capacitor switching element 106a for which the transistor is used is in an off state, electric charge stored in the first capacitor 105a is hardly released; therefore, the data is held. In addition, when the second capacitor switching element 106b for which the above transistor is used is in an off state, electric charge stored in the second capacitor 105b is hardly released; therefore, the data is held.

Figure 6A:
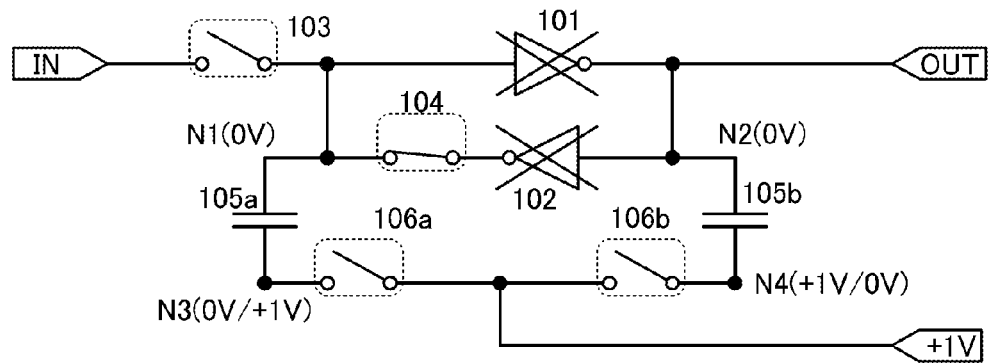
FIGS. 6A to 6C illustrate examples of operation of a memory element.
Figure 6B:
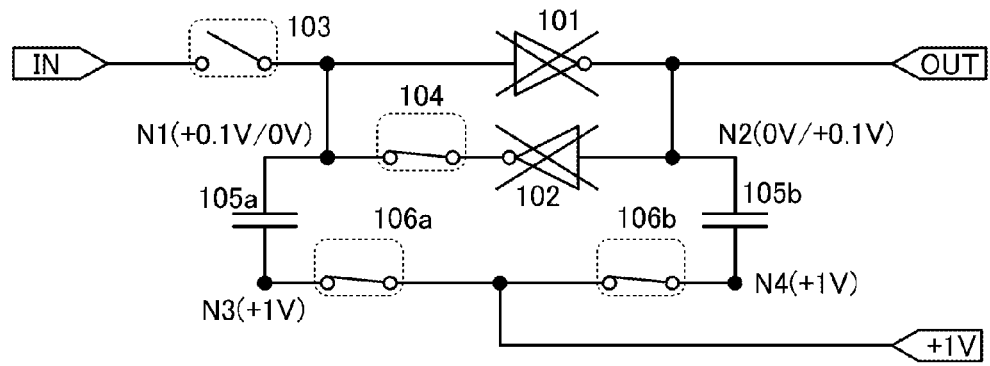

Now, the case where the data stored in the first capacitor 105a and the second capacitor 105b is read out is described with reference to FIGS. 6A to 6C. First, the switching element 103 is turned off. The first phase-inversion element 101 and the second phase-inversion element 102 are set to be in an inactive state. For example, a potential of 0 V is preferably applied to both the VDD and the VSS.

Then, the potentials of the first node N1 and the second node N2 are set to 0 V. At this time, there is no difference whether the switching element 104 is in an on state or in an off state. Since the potential of the first node N1 is 0 V, the potential of the third node N3 is either 0 V or +1 V in accordance with the written data. Further, the potential of the fourth node N4 is, either +1 V or 0 V, in accordance with the written data, which is the phase opposite to that of the third node. The potential VCC is set to +1 V (see FIG. 6A).

Then, the first capacitor switching element 106a is turned on, whereby the potential of the third node N3 becomes +1 V. At this time, the potential of one of electrodes of the first capacitor 105a changes, which leads to a change in the potential of the other electrode. For example, in the case where the potential of the third node N3 is initially 0 V, by turning on the first capacitor switching element 106a, the potential of the third node N3 is increased, and the potential of the other electrode of the first capacitor 105a (that is, the first node N1) is increased accordingly. In contrast, in the case where the potential of the third node N3 is initially +1 V, the potential of the third node N3 does not change, and the potential of the other electrode of the first capacitor 105a does not change accordingly.

By turning on the second capacitor switching element 106b, the same change in potential as that in the first capacitor 105a occurs in the second capacitor 105b. As a result, the potential of the second node N2 in the case where the potential of the fourth node N4 is initially +1 V does not change, and the potential of the second node N2 in the case where the potential of the fourth node N4 is 0 V increases.

As described in Embodiment 1, the degree of an increase of the potential is determined by the ratio between the capacitance of the first capacitor 105a and the capacitance including parasitic capacitance of the first node N1 and the ratio between the capacitance of the second capacitor 105b and the capacitance including parasitic capacitance of the second node N2. Here, the capacitance including parasitic capacitance of the first node N1 is four times the capacitance of the first capacitor 105a, and the capacitance including parasitic capacitance of the second node N2 is four times the capacitance of the second capacitor 105b.

Then, the potential of the first node N1 becomes +0.1 V or 0 V, and the potential of the second node N2 becomes 0 V or +0.1 V. In other words, in the case where the potential of the first node N1 at the time of writing data is +1 V (that is, the potential of the second node N2 at the time of writing data is 0 V), the potential of the first node N1 becomes +0.1 V and the potential of the second node N2 becomes 0 V. In contrast, in the case where the potential of the first node N1 at the time of writing data is 0 V (that is, the potential of the second node N2 at the time of writing data is +1 V), the potential of the first node N1 becomes 0 V and the potential of the second node N2 becomes +0.1 V (see FIG. 6B).

At this time, the gate capacitance of the first capacitor switching element 106a and the gate capacitance of the second capacitor switching element 106b are added to a circuit by turning on the first capacitor switching element 106a and the second capacitor switching element 106b; however, since the first capacitor 105a and the second capacitor 105b are provide, the potentials of the first node N1 and the second node N2 are not directly affected by the gate potentials of the capacitor switching element 106a and the second capacitor switching element 106b and thus do not fluctuate even when the gate capacitances are large.

Thus, the potentials of the first node N1 and the second node N2 are determined without being affected by the gate capacitances of the first capacitor switching element 106a and the second capacitor switching element 106b and gate potentials thereof. Therefore, the capacitances of the first capacitor 105a and the second capacitor 105b may be smaller than the gate capacitances of the first capacitor switching element 106a and the second capacitor switching element 106b.

Figure 6C:
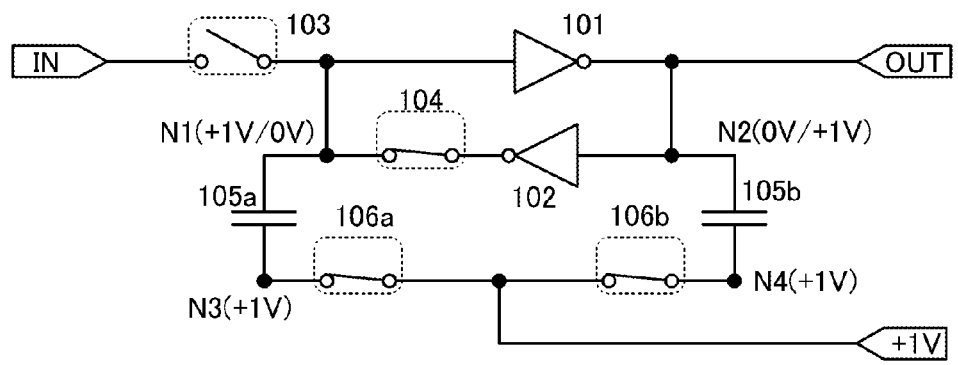

After that, in a state where the switching element 104 is in an on state and the potential of the VSS remains at 0 V, the potential of the VDD is increased to +1 V (see FIG. 6C). As a result, the potential difference between the first node N1 and the second node N2 is amplified. In other words, in the case where the potentials of the first node N1 and the second node N2 at the state of FIG. 6B are +0.1 V and 0 V, respectively, the potentials of the first node N1 and the second node N2 become +1 V and 0 V, respectively, by the increase of the potential of the VDD. Alternatively, in the case where the potentials of the first node N1 and the second node N2 at the state of FIG. 6B are 0 V and +0.1 V, respectively, the potentials of the first node N1 and the second node N2 become 0 V and +1 V, respectively, by the increase of the potential of the VDD. Thus, the state where data is written is restored.

In this embodiment, data can be restored without using an intermediate potential (+0.5 V) needed in the case of Embodiment 1. The matter disclosed in this embodiment can be implemented in appropriate combination with the matter described in the other embodiments.

(Embodiment 4)

In this embodiment, a method for forming an oxide semiconductor film is described with reference to FIG. 8B. First, an oxide semiconductor film is formed to have an appropriate thickness over the gate insulator 315. The oxide semiconductor film can be formed by a sputtering method in a rare gas (typically, argon) atmosphere, an oxygen atmosphere, or an atmosphere including a mixture of a rare gas (for example, argon) and oxygen. For the oxide semiconductor film, the above-described oxide semiconductor can be used.

Note that before the oxide semiconductor film is deposited by a sputtering method, dust on a surface of the embedding insulator 314 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that instead of an argon atmosphere, a nitrogen atmosphere, a helium atmosphere, or the like may be used. This treatment effects planarization of the surface. Further, an argon atmosphere to which oxygen, nitrous oxide, or the like is added may be used. Further alternatively, an argon atmosphere to which chlorine, carbon tetrafluoride, or the like is added may be used.

In this embodiment, as the oxide semiconductor film, an In—Ga—Zn-based oxide non-single-crystal film with a thickness of 5 nm, which is obtained by a sputtering method using a metal oxide target containing indium (In), gallium (Ga), and zinc (Zn), is used. As the target, a metal oxide target with such a composition ratio of metal atoms that In:Ga:Zn=1:1:0.5, In:Ga:Zn=1:1:1, or In:Ga:Zn=1:1:2 can be used, for example. In this embodiment, since crystallization is intentionally caused by performing heat treatment in a later step, it is preferable to use a metal oxide target by which crystallization is easily caused. The fill rate of the metal oxide target containing In, Ga, and Zn is higher than or equal to 90% and lower than or equal to 100%, and preferably higher than or equal to 95% and lower than or equal to 99.9%. When a metal oxide target having a high fill rate is used, the impurity concentration in an oxide semiconductor film to be formed can be reduced, so that a transistor with excellent electric characteristics or high reliability can be obtained.

The substrate is held in a treatment chamber kept under reduced pressure, a sputtering gas from which hydrogen and moisture are removed is introduced into the treatment chamber from which remaining moisture is being removed, and an oxide semiconductor film is formed over the insulating surface with use of a metal oxide as a target. The substrate temperature may be in the range of 100° C. to 600° C., preferably 200° C. to 400° C. during the film formation. Film formation is performed while the substrate is heated, whereby the concentration of an impurity contained in the formed oxide semiconductor film can be low and crystallinity can be increased. Further, damage by the sputtering can be suppressed.

In order to remove remaining moisture in the treatment chamber, an entrapment vacuum pump is preferably used. For example, a cryopump, an ion pump, or a titanium sublimation pump is preferably used. The evacuation unit may be a turbo pump provided with a cold trap. In a treatment chamber which is exhausted with the cryopump, for example, a hydrogen atom, a compound containing a hydrogen atom, such as water ($H_2O$), (more preferably, also a compound containing a carbon atom), and the like are removed, whereby the concentration of an impurity contained in the oxide semiconductor film formed in the treatment chamber can be low.

An example of the deposition condition is as follows: the distance between the substrate and the target is 170 mm, the pressure is 0.4 Pa, the electric power of the direct current (DC) power source is 0.5 kW, and the atmosphere is an oxygen atmosphere (the proportion of the oxygen flow rate is 100%). Note that a pulsed direct-current (DC) power source is preferable because powder substances (also referred to as particles) generated in film deposition can be reduced and the film thickness can be uniform. The preferable thickness of the oxide semiconductor film is from 1 nm to 30 nm inclusive. Since an appropriate thickness depends on an oxide semiconductor material used, the thickness can be determined as appropriate depending on the material.

In order to contain hydrogen, a hydroxyl group, and moisture as little as possible in the oxide semiconductor film, it is preferable that the substrate be preheated in a preheating chamber of a sputtering apparatus as pretreatment before formation of the oxide semiconductor film, so that impurities such as hydrogen or moisture attached on the substrate are discharged and eliminated. The temperature for the preheating is higher than or equal to 100° C. and lower than or equal to 600° C., preferably higher than or equal to 150° C. and lower than or equal to 300° C. As an evacuation unit provided in the preheating chamber, a cryopump is preferable. Note that this preheating treatment can be omitted.

Next, heat treatment is performed and crystals are grown from a surface of the oxide semiconductor film, so that an oxide semiconductor film at least part of which is crystallized or becomes single crystals is obtained. The heat treatment is performed at a temperature higher than or equal to 450° C. and lower than or equal to 850° C., preferably higher than or equal to 600° C. and lower than or equal to 700° C. In addition, heating time is longer than or equal to 1 minute and shorter than or equal to 24 hours. A single crystal layer includes a plate-shaped crystal obtained by crystal growth from the surface to the inside and has an average thickness greater than or equal to 2 nm and less than or equal to 10 nm. Further, the crystal layer formed at the surface has a surface parallel to an a-b plane and a c-axis alignment perpendicularly to the surface of the crystal layer. In this embodiment, the entire oxide semiconductor film may be crystallized by the heat treatment.

Note that in the heat treatment, it is preferable that water, hydrogen, and the like be not contained in nitrogen, oxygen, or a rare gas such as helium, neon, or argon. In addition, it is preferable that the purity of nitrogen, oxygen, or a rare gas such as helium, neon, or argon which is introduced to the heat treatment apparatus be 6N (99.9999%) or more, further preferably 7N (99.99999%) or more (that is, the impurity concentration is 1 ppm or lower, further preferably 0.1 ppm or lower). Further, the heat treatment may be performed in a dry air atmosphere with an $H_2O$ concentration lower than or equal to 20 ppm. In this embodiment, heat treatment in a dry air atmosphere at 700° C. for 1 hour is performed.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object to be processed by heat treatment, such as nitrogen or a rare gas such as argon, is used.

For example, the heat treatment can employ GRTA, in which the substrate is transferred into an inert gas heated at a high temperature of 650° C. to 700° C., and heated for several minutes there, and then taken out from the inert gas. With GRTA, high-temperature heat treatment for a short period of time can be achieved.

Next, by a photolithography method, the oxide semiconductor film is processed into the shape described in Embodiment 1, whereby the oxide semiconductor region 308 is formed. Note that a resist mask used in this process may be formed by an inkjet method. Formation of the resist mask by an inkjet method needs no photomask; thus, manufacturing cost can be reduced.

The matter disclosed in this embodiment can be implemented in appropriate combination with the matter described in the other embodiments.

(Embodiment 5)

Figure 9A:
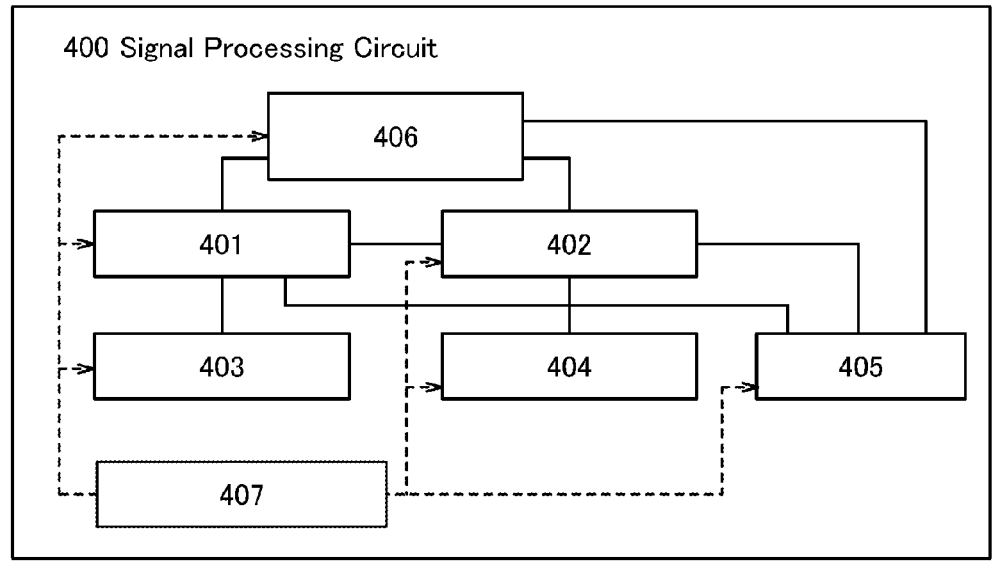
FIGS. 9A and 9B are block diagrams of a signal processing circuit and a CPU including a memory element.

FIG. 9A illustrates an example of a signal processing circuit according to one embodiment of the present invention, in which the memory element described in the above embodiment is used for a memory device. The signal processing circuit according to one embodiment of the present invention at least includes one or a plurality of arithmetic units and one or a plurality of memory devices. Specifically, a signal processing circuit 400 illustrated in FIG. 9A includes an arithmetic circuit 401, an arithmetic circuit 402, a memory device 403, a memory device 404, a memory device 405, a control device 406, and a power supply control circuit 407.

The arithmetic circuits 401 and 402 each include, as well as a logic circuit which carries out simple logic arithmetic processing, an adder, a multiplier, and various arithmetic units. The memory device 403 functions as a register for temporarily holding data when the arithmetic processing is carried out in the arithmetic circuit 401. The memory device 404 functions as a register for temporarily holding data when the arithmetic processing is carried out in the arithmetic circuit 402.

In addition, the memory device 405 can be used as a main memory and can store a program executed by the control device 406 as data or can store data from the arithmetic circuit 401 and the arithmetic circuit 402.

The control device 406 is a circuit which collectively controls operations of the arithmetic circuit 401, the arithmetic circuit 402, the memory device 403, the memory device 404, and the memory device 405 included in the signal processing circuit 400. Note that in FIG. 9A, the control device 406 is provided in the signal processing circuit 400 as a part thereof, but the control device 406 may be provided outside the signal processing circuit 400.

In the case where the memory element described in the above embodiment is used for at least one of the memory device 403, the memory device 404, and the memory device 405, data can be held even when supply of power supply voltage to the memory device 403, the memory device 404, and the memory device 405 is partly or completely stopped. In the above manner, the supply of the power supply voltage to the entire signal processing circuit 400 can be stopped partly or completely, whereby power consumption can be suppressed.

For example, the supply of the power supply voltage to one or more of the memory device 403, the memory device 404, and the memory device 405 is stopped, whereby power consumption can be suppressed. Alternatively, for example, in FIGS. 1A and 1B, the potential of the VDD and the potential of the VSS of the memory element 100 are equal to each other, and the signal Sig. 3 is set to the certain artificial potential (that is a potential lower than the ground potential by 0.5 V to 1.5 V), which is effective in reducing the power consumption.

When the signal Sig. 3 is set to the above potential, the current is considered to flow between the gate electrode and the oxide semiconductor region in the capacitor switching element 106; however, the value of the current is too small to be measured. That is, the current does not lead to power consumption. In contrast, when there is a measurable potential difference between the VDD and the VSS, the through current of the inverter is generated, and the considerable amount of power is accordingly consumed. Thus, stop of the supplying power to the VDD and the VSS produces a great effect of reducing power consumption.

In addition, as well as the supply of the power supply voltage to the memory device, the supply of the power supply voltage to the control circuit or the arithmetic circuit which transmits/receives data to/from the memory device may be stopped. For example, when the arithmetic circuit 401 and the memory device 403 are not operated, the supply of the power supply voltage to the arithmetic circuit 401 and the memory device 403 may be stopped.

In addition, the power supply control circuit 407 controls the level of the power supply voltage which is supplied to the arithmetic circuit 401, the arithmetic circuit 402, the memory device 403, the memory device 404, the memory device 405, and the control device 406 included in the signal processing circuit 400. As described above, the power supply control circuit controls VDD, VSS, and a potential of signal Sig. 3 as needed, and thus, consumed power can be reduced in a most effectively manner.

When the supply of the power supply voltage is stopped, the supply of the power supply voltage to the power supply control circuit 407 may be stopped, or the supply of the power supply voltage to the arithmetic circuit 401, the arithmetic circuit 402, the memory device 403, the memory device 404, the memory device 405, and the control device 406 may be stopped. That is, a switching element for stopping the supply of the power supply voltage may be provided for the power supply control circuit 407, or each of the arithmetic circuit 401, the arithmetic circuit 402, the memory device 403, the memory device 404, the memory device 405, and the control device 406. In the latter case, the power supply control circuit 407 is not necessarily provided in the signal processing circuit of the present invention.

A memory device which functions as a cache memory may be provided between the memory device 405 that is a main memory and each of the arithmetic circuit 401, the arithmetic circuit 402, and the control device 406. By providing the cache memory, low-speed access to the main memory can be reduced and the speed of the signal processing such as arithmetic processing can be higher. By applying the above-described memory element also to the memory device functioning as a cache memory, power consumption of the signal processing circuit 400 can be suppressed.

(Embodiment 6)

In this embodiment, a configuration of a CPU, which is one of signal processing circuits according to one embodiment of the present invention, will be described.

Figure 9B:
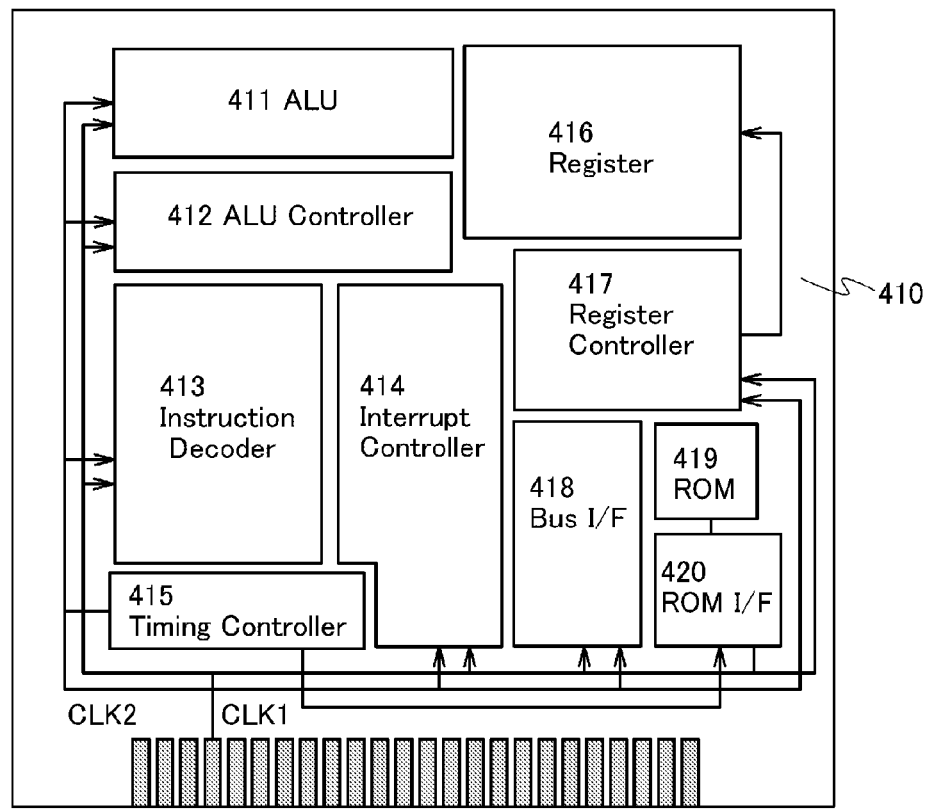

FIG. 9B illustrates a configuration of a CPU in this embodiment. The CPU illustrated in FIG. 9B mainly includes an arithmetic logic unit (ALU) 411, an ALU controller 412, an instruction decoder 413, an interrupt controller 414, a timing controller 415, a register 416, a register controller 417, a bus interface (Bus I/F) 418, a rewritable ROM 419, and a ROM interface (ROM I/F) 420, over a substrate 410. The ROM 419 and the ROM interface 420 may be provided over another chip. Naturally, the CPU illustrated in FIG. 9B is only an example with a simplified configuration, and various configurations can be applied to an actual CPU depending on the application.

An instruction input to the CPU via the Bus I/F 418 is input to the instruction decoder 413 and decoded therein, and then input to the ALU controller 412, the interrupt controller 414, the register controller 417, and the timing controller 415.

In accordance with the decoded instruction, the ALU controller 412, the interrupt controller 414, the register controller 417, and the timing controller 415 conduct various controls. Specifically, the ALU controller 412 generates a signal for controlling operation of the ALU 411. While the CPU is executing a program, the interrupt controller 414 judges an interrupt request from an external input/output device or a peripheral circuit on the basis of its priority or a mask state, and processes the request. The register controller 417 generates an address of the register 416 and reads/writes data from/to the register 416 in accordance with the state of the CPU.

Further, the timing controller 415 generates a signal for controlling a timing of operation of the ALU 411, the ALU controller 412, the instruction decoder 413, the interrupt controller 414, and the register controller 417. For example, the timing controller 415 includes an internal clock generator for generating an internal clock signal CLK2 based on a reference clock signal CLK1, and supplies the clock signal CLK2 to the above circuits.

In the CPU in this embodiment, the register 416 may include a memory element with the above structure described in the above embodiment. The register controller 417 selects operation of holding data in the register 416 in accordance with the ALU 411. That is, the register controller 417 determines whether data is held by a phase-inversion element or by a capacitor in the memory element included in the register 416. When data holding by the phase-inversion element is selected, power supply voltage is supplied to the memory element in the register 416. When data holding by the capacitor is selected, the data is rewritten in the capacitor, and supply of power supply voltage to the memory element in the register 416 can be stopped.

In such a manner, even in the case where the operation of the CPU is temporarily stopped and the supply of the power supply voltage is stopped, data can be held and the consumed power can be reduced. Specifically, for example, while a user of a personal computer does not input data to an input device such as a keyboard, the operation of the CPU can be stopped, so that the power consumption can be reduced.

Although the CPU is given as an example in this embodiment, the signal processing circuit of the present invention is not limited to be applied to the CPU, but can be applied to an LSI such as a DSP, a custom LSI, or a field programmable gate array (FPGA). With use of a signal processing circuit described in the present invention, a highly reliable electronic device and an electronic device with low power consumption can be provided.

In particular, when to a portable electronic device which has difficulty in continuously receiving power from an external device, a signal processing circuit with low power consumption according to one embodiment of the present invention is added as a component of the device, an advantage in increasing the continuous operation time can be obtained.

The signal processing circuit according to one embodiment of the present invention can be used for display devices, personal computers, or image reproducing devices provided with recording media (typically, devices which reproduce the content of recording media such as digital versatile discs (DVDs) and have displays for displaying the reproduced images). Other than the above, as an electronic device which can be provided with the signal processing circuit according to one embodiment of the present invention, mobile phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given.

This application is based on Japanese Patent Application serial no. 2011-106401 filed with Japan Patent Office on May 11, 2011, the entire contents of which are hereby incorporated by reference.

What is claimed is:

1. A semiconductor device comprising:
a pair of inverters, wherein an output terminal of one of the inverters is connected to an input terminal of the other of the inverters to hold data;
a capacitor; and
a switching element, the switching element being provided over at least one of the inverters and configured to control writing of data to the capacitor,
wherein one of electrodes of the capacitor is connected to one of an output terminal and an input terminal of one of the pair of inverters and the other electrode of the capacitor is connected to one of a source and a drain of the switching element, and
wherein the other electrode of the capacitor is configured to be in a floating state when the switching element is off.

2. The semiconductor device according to claim 1, wherein a channel length in the switching element is ten times as large as the minimum feature size or more.

3. The semiconductor device according to claim 1, wherein a channel length of the switching element is greater than or equal to 1 μm.

4. The semiconductor device according to claim 1, wherein a capacitance of the capacitor is lower than a gate capacitance of the switching element.

5. The semiconductor device according to claim 1, wherein the switching element includes an oxide semiconductor in a channel formation region.

6. The semiconductor device according to claim 5, wherein the oxide semiconductor is an In—Ga—Zn oxide.

7. The semiconductor device according to claim 5, wherein a hydrogen concentration of the channel formation region is lower than or equal to $5\times10^{19}/cm^3$.

8. The semiconductor device according to claim 1, wherein one of the pair of inverters is a clocked inverter.

9. A method for driving the semiconductor device according to claim 1, comprising the steps of:
setting both a potential of the input terminal and a potential of the output terminal of the inverters to a first potential in a state where the switching element is in an off state;
turning on the switching element; and
activating the inverters,
wherein the first potential is higher than a potential that is lower of potentials supplied to the inverters when the inverters are in an active state, and
wherein the first potential is lower than a potential that is higher of the potentials supplied to the inverters when the inverters are in an active state.

10. A semiconductor device comprising:
a pair of inverters, wherein an output terminal of one of the inverters is connected to an input terminal of the other of the inverters to hold data;
a first capacitor;
a first switching element, the first switching element being provided over at least one of the inverters and configured to control writing of data to the first capacitor,
a second capacitor; and
a second switching element, the second switching element being provided over at least one of the inverters and configured to control writing of data to the second capacitor,
wherein one of electrodes of the first capacitor is connected to an input terminal of one of the pair of inverters,
wherein the other electrode of the first capacitor is connected to one of a source and a drain of the first switching element,
wherein one of electrodes of the second capacitor is connected to the input terminal of the other of the pair of inverters,
wherein the other electrode of the second capacitor is connected to one of a source and a drain of the second switching element,
wherein the other electrode of the first capacitor is configured to be in a floating state when the first switching element is off, and
wherein the other electrode of the second capacitor is configured to be in a floating state when the second switching element is off.

11. The semiconductor device according to claim 10, wherein a channel length in the first switching element is ten times as large as the minimum feature size or more.

12. The semiconductor device according to claim 10, wherein a channel length of the first switching element is greater than or equal to 1 μm.

13. The semiconductor device according to claim 10, wherein a capacitance of the first capacitor is lower than a gate capacitance of the first switching element.

14. The semiconductor device according to claim 10, wherein the first switching element includes an oxide semiconductor in a channel formation region.

15. The semiconductor device according to claim 14, wherein the oxide semiconductor is an In—Ga—Zn oxide.

16. A method for driving the semiconductor device according to claim 10, comprising the steps of:
setting both a potential of the input terminal and a potential of the output terminal of the inverters to a first potential in a state where the first switching element and the second switching element are in off state;
turning on the first switching element and the second switching element; and
activating the inverters.

17. A semiconductor device comprising:
- a pair of inverters, wherein an output terminal of one of the inverters is connected to an input terminal of the other of the inverters to hold data;
- a capacitor; and
- a switching element, the switching element comprising a semiconductor layer and being provided over at least one of the inverters and configured to control writing of data to the capacitor,
- wherein one of electrodes of the capacitor is connected to one of an output terminal and an input terminal of one of the pair of inverters and the other electrode of the capacitor is connected to one of a source and a drain of the switching element,
- wherein the other electrode of the capacitor is configured to be in a floating state when the switching element is off, and
- wherein the switching element has at least one hollow portion in the semiconductor layer.

18. The semiconductor device according to claim 17, wherein a channel length in the switching element is ten times as large as the minimum feature size or more.

19. The semiconductor device according to claim 17, wherein a channel length of the switching element is greater than or equal to 1 μm.

20. The semiconductor device according to claim 17, wherein a capacitance of the capacitor is lower than a gate capacitance of the switching element.

* * * * *